(12) United States Patent
Wu et al.

(10) Patent No.: US 10,483,334 B1
(45) Date of Patent: Nov. 19, 2019

(54) DISPLAY PANEL AND ELECTRONIC DEVICE COMPRISING THEREOF

(71) Applicant: Au Optronics Corporation, Hsinchu (TW)

(72) Inventors: Yu-Chin Wu, Hsinchu (TW); Chia-Tien Chou, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/038,194

(22) Filed: Jul. 18, 2018

(30) Foreign Application Priority Data

May 9, 2018 (TW) .............................. 107115689 A

(51) Int. Cl.
| | |
|---|---|
| *H01L 27/32* | (2006.01) |
| *H01L 33/50* | (2010.01) |
| *H01L 27/15* | (2006.01) |
| *H01L 33/58* | (2010.01) |
| *H01L 33/62* | (2010.01) |
| *H01L 31/0224* | (2006.01) |

(52) U.S. Cl.
CPC ........ *H01L 27/3234* (2013.01); *H01L 27/156* (2013.01); *H01L 27/322* (2013.01); *H01L 27/323* (2013.01); *H01L 27/3211* (2013.01); *H01L 27/3246* (2013.01); *H01L 27/3262* (2013.01); *H01L 27/3272* (2013.01); *H01L 27/3276* (2013.01); *H01L 31/022466* (2013.01); *H01L 33/505* (2013.01); *H01L 33/58* (2013.01); *H01L 33/62* (2013.01)

(58) Field of Classification Search
CPC . H01L 27/323; H01L 27/322; H01L 27/3272; H01L 27/3211
See application file for complete search history.

(56) References Cited

U.S. PATENT DOCUMENTS

| | | | | |
|---|---|---|---|---|
| 7,580,014 | B2 * | 8/2009 | Tanaka | G09G 3/325 |
| | | | | 345/76 |
| 8,164,042 | B2 | 4/2012 | Tseng et al. | |
| 9,698,380 | B2 * | 7/2017 | Cheng | H01L 51/5253 |

(Continued)

FOREIGN PATENT DOCUMENTS

| | | |
|---|---|---|
| CN | 101697021 | 4/2010 |
| CN | 101740588 | 6/2010 |

(Continued)

*Primary Examiner* — Kyoung Lee
*Assistant Examiner* — Christina A Sylvia
(74) *Attorney, Agent, or Firm* — JCIPRNET

(57) ABSTRACT

A display panel comprising a first substrate, a second substrate, a color conversion layer, and an image sensing layer. A plurality of display units are between the first substrate and the second substrate. At least one of the plurality of display units has at least three sub-pixels. Each of the sub-pixels at least has one display region and a light shielding region disposed on at least one side of the display region. The color conversion layer is disposed in the display unit. Each of the color conversion elements is disposed in at least one portion of the light shielding region of each of the sub-pixels. The image sensing layer is disposed on the display unit and at least partially overlaps the color conversion layer. Each of the image sensing elements is disposed in at least one portion of the light shielding region of each of the sub-pixels to serve as an image sensing region.

16 Claims, 11 Drawing Sheets

(56) References Cited

U.S. PATENT DOCUMENTS

| | | | | |
|---|---|---|---|---|
| 2003/0230972 | A1* | 12/2003 | Cok | ............... H01L 27/3211 313/504 |
| 2005/0140275 | A1* | 6/2005 | Park | ............... H01L 27/3209 313/504 |
| 2010/0108866 | A1 | 5/2010 | Tseng et al. | |
| 2017/0139250 | A1 | 5/2017 | Li et al. | |
| 2018/0077371 | A1 | 3/2018 | Park | |

FOREIGN PATENT DOCUMENTS

| | | |
|---|---|---|
| CN | 105741748 | 7/2016 |
| CN | 106707576 | 5/2017 |
| TW | 201037393 | 10/2010 |
| TW | 201626195 | 7/2016 |

\* cited by examiner

DISPLAY PANEL AND ELECTRONIC DEVICE COMPRISING THEREOF

CROSS-REFERENCE TO RELATED APPLICATION

This application claims the priority benefit of Taiwan application serial no. 107115689, filed on May 9, 2018. The entirety of the above-mentioned patent application is hereby incorporated by reference herein and made a part of this specification.

BACKGROUND

Field of the Disclosure

The disclosure is related to a semiconductor device, and particularly to a display panel and an electronic device comprising thereof.

Description of Related Art

With the advantages of being compact, small and power-saving, display panel has been commonly applied in various electronic products such as smart phone, notebook computer, tablet PC and TV. Typically, electronic products having high "screen-to-body ratio" provide user with larger field of view and greater sense of immersion. Take smart phone as an example, "screen-to-body ratio" generally refers to a ratio of the area of a pixel region of displayable image of a display screen to an orthogonal projection area are of the body of smart phone. In view of the above, it is an important issue to find out how to increase screen-to-body ratio.

SUMMARY OF THE DISCLOSURE

The disclosure provides a display panel embedded with an image sensing element and an electronic device including the display panel. A valid display region of the display panel may be less affected and may even be improved, and the image sensing capability of the display panel may be less affected and may even be enhanced. The display panel embedded with image sensing element, the weight of the display panel may be lighter and/or the thickness thereof may be thinner. The electronic device includes the display panel and thus having high screen-to-body ratio and/or image sensing capability, and the weight of the electronic device may be lighter and/or the thickness thereof may be thinner.

A display panel of the disclosure includes a first substrate, a second substrate, a color conversion layer and an image sensing layer. The second substrate and the first substrate correspond to each other. A plurality of display units are provided between the first substrate and the second substrate. At least one of the plurality of display units has at least three sub-pixels, and each of the sub-pixels displays different colors. Each of the sub-pixels has at least one switch element. The switch element and a signal line are electrically connected. Each of the sub-pixels at least has one display region and a light-shielding region disposed on at least one side of the display region. The display region at least has one display element. The color conversion layer is disposed in the display unit. The color conversion layer has at least three color conversion elements. The color conversion elements respectively correspond to the sub-pixels, and convert into different colors. Each of the color conversion elements is disposed in at least one portion of the light shielding region of each of the sub-pixels. The image sensing layer is disposed on the display unit and at least partially overlaps the color conversion layer. The image sensing layer has at least three image sensing elements. The image sensing elements respectively correspond to the sub-pixels. Each of the image sensing elements is electrically connected to a reading line through at least one reading element. Each of the image sensing elements is disposed in at least one portion of the light shielding region of each of the sub-pixels to serve as an image sensing region.

In order to make the aforementioned features and advantages of the disclosure more comprehensible, embodiments accompanying figures are described in detail below.

DESCRIPTION OF EMBODIMENTS

Figure 1:
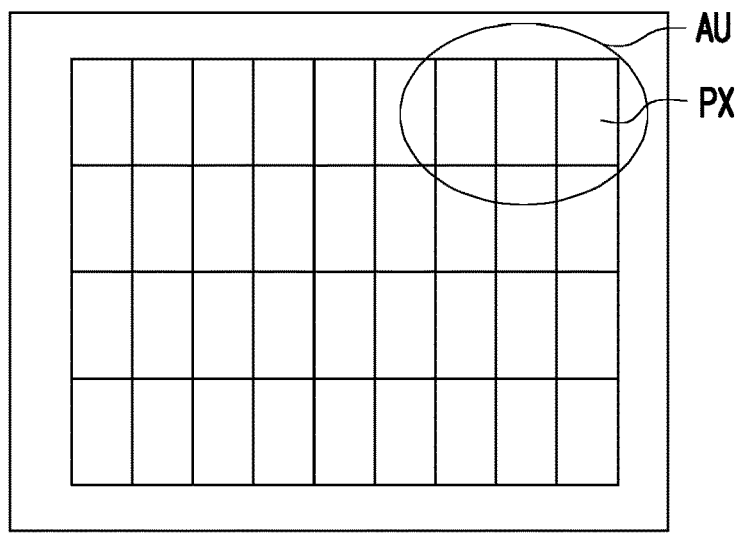
FIG. 1 is a top view of a display panel according to an embodiment of the disclosure.

In the drawings, the thickness of layers, films, panels, regions, etc., are exaggerated for clarity. Like reference numerals designate like elements throughout the specification. It will be understood that when an element such as a layer, film, region, or substrate is referred to as being "on" or "connected to" another element, it can be directly on or connected to the other element or intervening elements may also be present. In contrast, when an element is referred to as being "directly on" or "directly connected to" another element, there are no intervening elements present. As used herein, "connected" may refer to a physical and/or electrical connection. Furthermore, "electrically connected" or "coupled" may be other elements between two elements.

The term "about," "roughly," "approximately" or "substantially" as used herein is inclusive of the stated value and means within an acceptable range of deviation for the particular value as determined by persons of ordinary skill in the art, considering the measurement in question and the error associated with measurement of the particular quantity (i.e., the limitations of the measurement system). For example, "about" may mean within one or more standard deviations, or within ±30%, ±20%, ±10%, ±5% of the stated value. Moreover, a relatively acceptable range of deviation or standard deviation may be chosen for the term "about," "approximately" or "substantially" as used herein based on optical properties, etching properties or other properties, instead of applying one standard deviation across all the properties.

Unless otherwise defined, all terms (including technical and scientific terms) used herein have the same meaning as commonly understood by persons of ordinary skill in the art. It will be further understood that terms, such as those defined in commonly used dictionaries, should be interpreted as having a meaning that is consistent with their meaning in the context of the relevant art and the invention and will not be interpreted in an idealized or overly formal sense unless expressly so defined herein.

The schematic views are only meant to illustrate some embodiments of the disclosure. Thus, the shape, number and proportional size of each of the elements illustrated in the schematic views should not be considered limitations on the disclosure. For instance, the actual number, size and shape of components such as sub-pixels in FIG. 1 are only illustrated for the purpose of exemplification, and it is not necessary that the actual number, size and shape of the components such as sub-pixels of the disclosure must be shown as in the drawings.

FIG. 1 is a top view of a display panel according to an embodiment of the disclosure. Referring to FIG. 1, in the embodiment, a display panel 10 includes, for example, a plurality of display units AU. In an embodiment, a region of the display panel 10 where the plurality of display units AU are disposed may be referred to as a display pixel region. At least one of the plurality of display units AU, for example, has three sub-pixels PX. The sub-pixels PX each may display different colors. In an embodiment, the different colors displayed by the sub-pixels PX are three primary colors such as red color, green color and blue color, but the disclosure is not limited thereto. In other embodiments, at least one of the plurality of display units AU may have four, five or six sub-pixels PX and so on depending on the design, and three sub-pixels PX may display different colors which are three primary colors. Other sub-pixels of the sub-pixels PX may display white color, yellow color, at least one of the three primary colors, or other suitable color.

Figure 2:
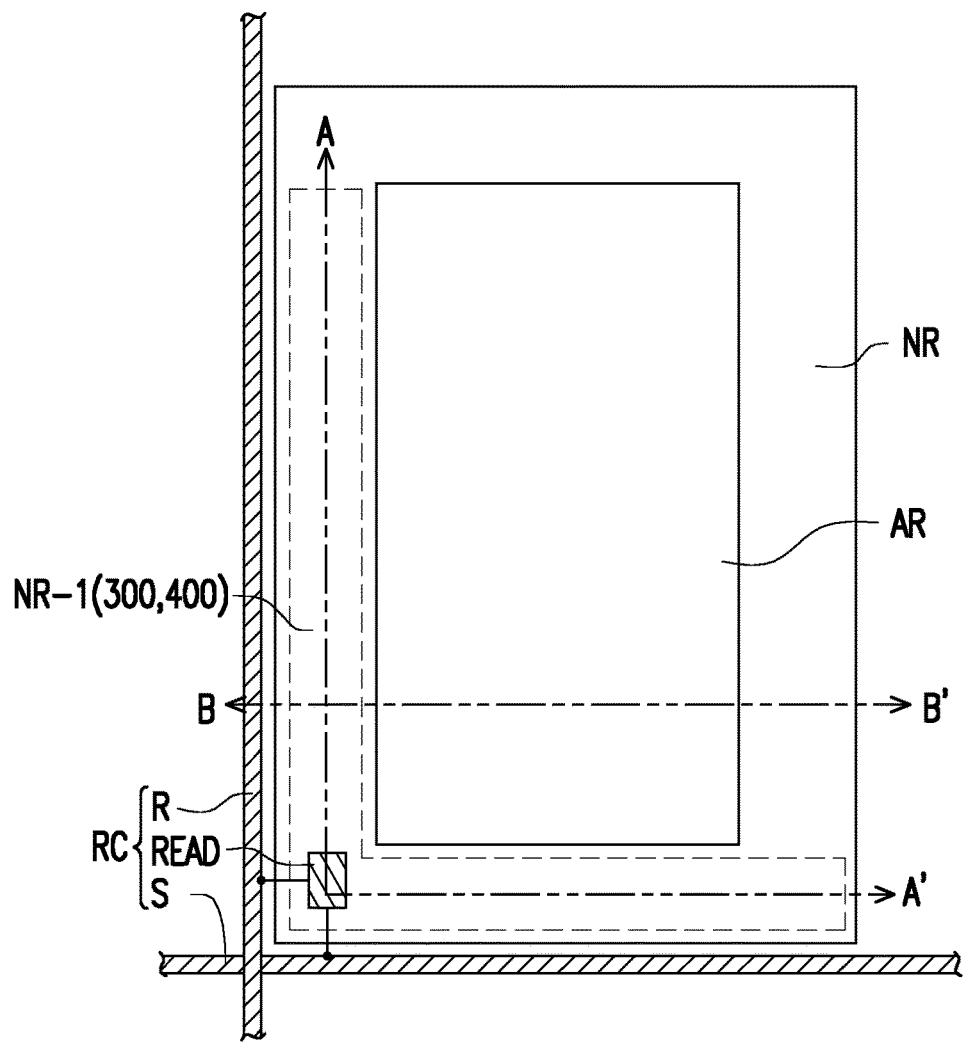
FIG. 2 is a top view of a sub-pixel of a display panel according to an embodiment of the disclosure.

FIG. 2 is a top view of a sub-pixel of a display panel according to an embodiment of the disclosure. Referring to FIG. 2, the range of a single sub-pixel PX of the display panel 10 in the embodiment is, for example, defined by a reading line R and a selecting line S, which should not be construed as a limitation to the disclosure. The single sub-pixel PX may be provided with a plurality of signal lines (not shown). The signal line may be, for example, at least one of the at least one scan line (not shown), at least one data line (not shown), at least one common electrode line (not shown), at least one power supply line (not shown) or other suitable line. In other embodiments, the range of the single sub-pixel PX may be defined by two adjacent signal lines having the same function (e.g., two data lines or two high-level power supply lines, the disclosure is not limited thereto) and other two adjacent signal lines having the same function (e.g., two scan lines, two common electrode lines or two low-level power supply lines, the disclosure is not limited thereto) configured in an interlaced manner (vertically, for example), but the disclosure is not limited thereto. In other embodiments, the range of the single sub-pixel PX is defined by, for example, two adjacent signal lines having the same function (e.g., two data lines or two high-level power supply lines, the disclosure is not limited thereto) and two adjacent signal lines having different functions (e.g., one scan line and one common electrode line or one scan line and one low-level power supply line, the disclosure is not limited thereto) configured in an interlaced manner (vertically, for example). In other embodiments, the range of the single sub-pixel PX may be defined by two adjacent signal lines having different functions (e.g., one data line and one high-level power supply line, the disclosure is not limited thereto) and two adjacent signal lines having the same function (e.g., two scan lines, two common electrode lines, or two low-level power supply lines, the disclosure is not limited thereto) configured in an interlaced manner (vertically, for example). In other embodiments, the range of the single sub-pixel PX may be defined by two adjacent signal lines having different functions (e.g., one data line and one high-level power supply line, the disclosure is not limited thereto) and other two adjacent signal lines having different functions (e.g., one scan line and one common electrode line or one scan line and one low-level power supply line, the disclosure is not limited thereto) configured in an interlaced manner (vertically, for example).

Further referring to FIG. 2, the single sub-pixel PX, for example, has a light shielding region NR and a display region AR. Since the light shielding region NR of the single sub-pixel PX is a region that does not display the frame (or namely the image) and thus may be referred to as a non-display region. In an embodiment, the light shielding region NR is disposed on at least one side of the display region AR or surrounds the display region AR. In the embodiment, the light shielding region NR, for example, surrounds the display region AR, but the disclosure is not limited thereto.

Figure 3:
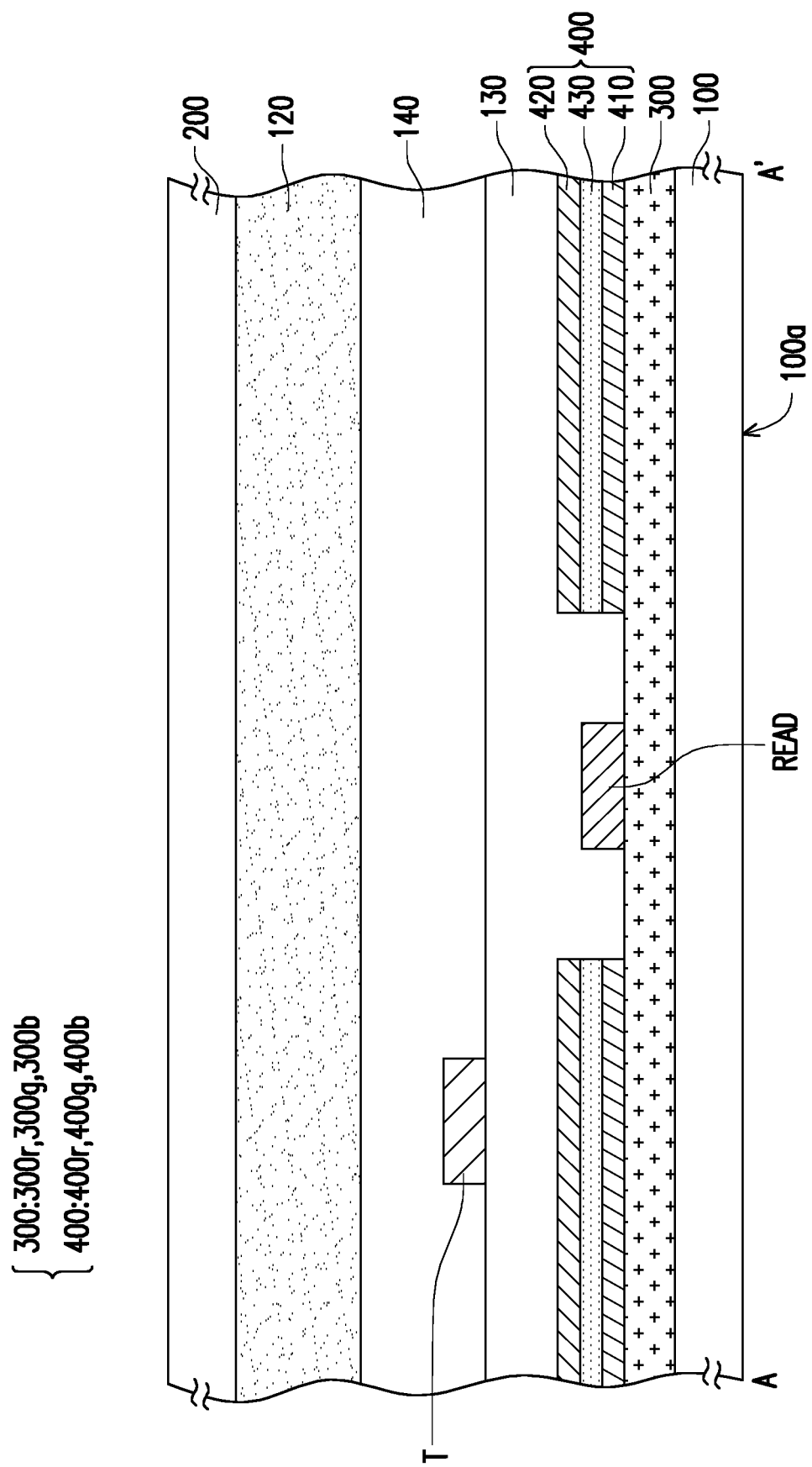
FIG. 3 is a schematic cross-sectional view of a sub-pixel in an embodiment of a display panel in a first embodiment of FIG. 2 taken along line A-A'.
Figure 4:
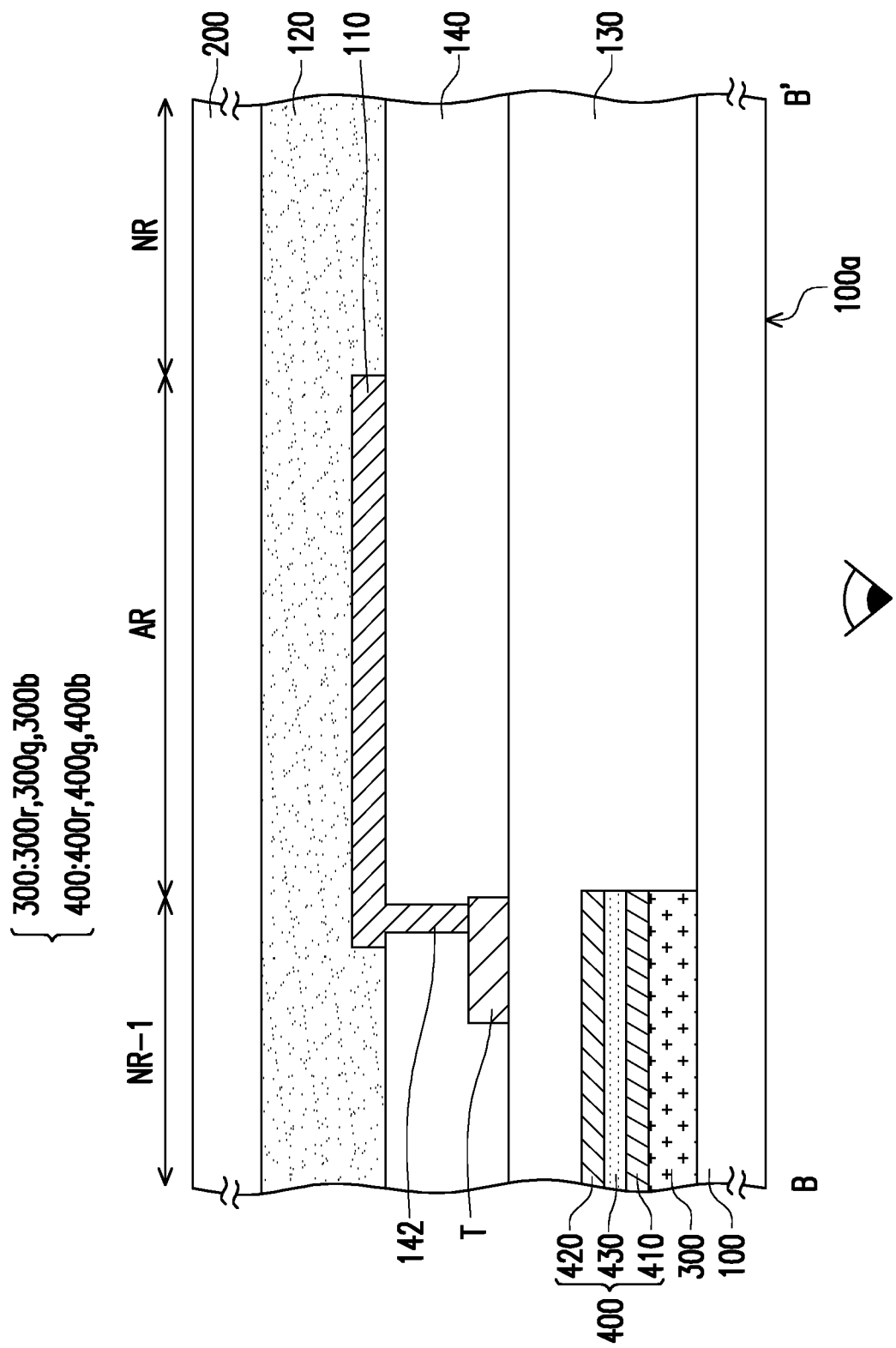
FIG. 4 is a schematic cross-sectional view of a sub-pixel in an embodiment of the display panel in the first embodiment of FIG. 2 taken along line B-B'.

FIG. 3 is a schematic cross-sectional view of a sub-pixel in an embodiment of a display panel in a first embodiment of FIG. 2 taken along line A-A'. FIG. 4 is a schematic cross-sectional view of a sub-pixel in an embodiment of the display panel in the first embodiment of FIG. 2 taken along line B-B'. Referring to FIG. 2, FIG. 3 and FIG. 4, the display panel 10 in the embodiment may include a first substrate 100, a second substrate 200, a color conversion layer 300 and an image sensing layer 400.

The first substrate 100 and the second substrate 200 are disposed correspondingly. The first substrate 100 and the second substrate 200 may include a rigid substrate or a flexible substrate, and the material thereof is, for example, a glass substrate, a plastic substrate, or other suitable material, or a combination thereof. The plurality of display units AU are, for example, disposed between the first substrate 100 and the second substrate 200. In the embodiment, an outer surface 100*a* of the first substrate 100 may serve as a viewing surface as shown in FIG. 4, for example. From another perspective, the display surface of the display panel 10 may be the outer surface 100*a* of the first substrate 100, which may provide a display image for user to watch.

The color conversion layer 300 is disposed on the display units AU. From another perspective, the color conversion layer 300 and the display units AU are partially overlapped.

The color conversion layer 300 may have at least three color conversion elements such as color conversion elements 300r, 300g and 300b, and each of the color conversion elements 300r, 300g and 300b may respectively convert into different colors and correspond to the sub-pixels PX (e.g., sub-pixels of different colors). From another perspective, each of the color conversion elements 300r, 300g and 300b may be, for example, disposed in at least one portion of the light shielding region NR of each of the sub-pixels PX. In an embodiment, the different colors converted by the color conversion elements 300r, 300g and 300b may be, for example, three primary colors such as red color, green color and blue color, but the discourse is not limited thereto. In an embodiment, the material of the color conversion elements 300r, 300g and 300b may be an organic material or an inorganic material, and may be a structure having single layer or at least two layers. That is, the color conversion elements 300r, 300g and 300b may be, for example, a single layer or at least two layers respectively. When the color conversion elements 300r, 300g and 300b are at least two layers, the refractive index of the layers may be different from each other, such that the light is refracted into different colors such as red color, blue color or green color, but the disclosure is not limited thereto. Preferably, the material of the color conversion elements is, for example, an inorganic material, but the disclosure is not limited thereto. In some embodiments, the material of the color conversion elements may be an insulating material, a metal material or a metal material and an insulating material or other suitable material. In other embodiments, the color conversion elements 300r, 300g and 300b may include color resist, quantum dot (rod) or other suitable color conversion material, or a combination or a stack of at least two of the above materials. The color conversion elements 300r, 300g and 300b of the color conversion layer 300 may also be referred to as a wavelength conversion element of a wavelength conversion layer.

The image sensing layer 400 is disposed on the display unit AU and at least partially overlaps the color conversion layer 300. From another perspective, the image sensing layer 400 may be, for example, disposed in at least one portion of the light shielding region NR of the sub-pixel PX to serve as an image sensing region NR-1. In the embodiment, the light shielding region NR surrounding two sides of the display region AR may be the image sensing region NR-1 as shown in FIG. 2, for example, but the disclosure is not limited thereto. In other embodiments, the light shielding region NR surrounding three sides or four sides of the display region AR may be the image sensing region NR-1, and the elements (e.g., corresponding color conversion elements 300r, 300g, 300b and corresponding image sensing elements 400r, 400g and 400b described below) corresponding to the image sensing region NR-1 may be disposed here. The image sensing layer 400 has at least three image sensing elements, for example, the image sensing elements 400r, 400g and 400b may respectively correspond to different color conversion elements 300r, 300g and 300b to sense a corresponding color. For example, the image sensing element 400r (e.g., red color image sensing element 400r) of a first color corresponds to and senses the first color conversion element 300r (e.g., red color conversion element 300r); the image sensing element 400 (e.g., green color image sensing element 400g) of a second color corresponds to and senses the second color conversion element 300g (e.g., green color conversion element 300g); the image sensing element 400b (e.g., blue color image sensing element 400b) of a third color corresponds to and senses the third color conversion element 300b (e.g., blue color conversion element 300b), but the disclosure is not limited thereto. Additionally, the image sensing elements 400r, 400g and 400b may be electrically connected to a corresponding reading circuit RC, respectively. Preferably, the reading circuit RC includes at least one reading element READ and a reading line R, thereby reading the signal converted by one of the corresponding image sensing elements 400r, 400g and 400b more accurately, but the disclosure is not limited thereto. In other embodiment, the reading circuit RC may be only include the reading line R, but the disclosure is not limited thereto. The reading element READ may be disposed on the first substrate 100 and electrically connected to the reading line R. Preferably, the reading element READ may be further selectively electrically connected to the selecting line S, thereby reading the signal converted by the corresponding image sensing element (e.g., one of the image sensing elements 400r, 400g, 400b) more accurately, but the disclosure is not limited thereto. In the embodiment, preferably the image sensing region NR-1 is provided with the reading element READ. In some embodiments, the reading element READ may be disposed in the display region AR or a portion of the image sensing region NR-1 and a portion of the display region AR.

The reading element READ may be, for example, a thin film transistor element which includes a gate electrode, a gate insulating layer, a semiconductor channel layer, a source electrode and a drain electrode. For example, the reading element READ may be a bottom gate thin film transistor element; for example, the gate electrode is located under the semiconductor channel layer, but the disclosure is not limited thereto. The reading element READ may also be a top gate thin film transistor element; for example, the gate electrode is located above the semiconductor channel layer or other type of switch element. The semiconductor channel layer may be a single-layer structure or a multi-layer structure, and the material thereof may be amorphous silicon, mono-crystalline, nano-crystalline silicon, microcrystalline silicon, polysilicon, organic semiconductor material, oxide semiconductor material, nano-carbon tube/rod, perovskite, or other suitable material.

The image sensing elements 400r, 400g and 400b of the image sensing layer 400, for example, each includes a sensing electrode (e.g., first electrode 410), another sensing electrode (e.g., second electrode 420) and a photoelectric conversion layer 430. The sensing electrode (e.g., first electrode 410) and another sensing electrode (e.g., second electrode 420) correspond to each other, and the photoelectric conversion layer 430 is disposed between the sensing electrode (e.g., first electrode 410) and another sensing electrode (e.g., second electrode 420). The photoelectric conversion layer 430 may be configured to convert light (e.g., colored light) into a corresponding electrical signal. The structure of the photoelectric layer 430 may be a single layer or multiple layers, and the material thereof may include an organic semiconductor material, an inorganic semiconductor material, graphene, nano-carbon tube (rod), perovskite, or other suitable material. In an embodiment, the photoelectric conversion layer 430 may be in the form of a stack of P-N semiconductor material, a stack of P-I-N semiconductor material or other types of semiconductor material stack. The structure of at least one of the image sensing elements 400r, 400g and 400b may be a P-N diode, a P-I-N diode, or other suitable structure. The material of one of the first electrode 410 and the second electrode 420 may be, for example, a transparent or a semi-transparent conductive material such as zinc-oxide (ZnO), indium-tin-oxide (ITO), indium-zinc-oxide (IZO), indium-galliumzinc-oxygen (IGZO), indium-gallium-oxide (IGO), zinc-gallium-oxide (ZGO), graphene, nano-carbon tube/rod, metal or alloy smaller than 60 Å, or other suitable material; and the material of other one of the first electrode 410 and the second electrode 420 may be a reflective conductive material (or referred to as a non-transparent conductive material), or a stack layer selected from a reflective conductive material and a transparent conductive material such as metal, alloy, nitride of metal material, oxide of metal material, oxynitride of metal material or other suitable material, or a stack layer of at least two of the above materials, but the disclosure is not limited thereto.

Referring to FIG. 3 and FIG. 4, the display region AR of each sub-pixels PX of the display panel 10 may be, for example, provided with a display medium layer 120 (or referred to as display element). For example, the display medium layer 120 may be disposed between the first substrate 100 and the second substrate 200. In the embodiment, the display medium layer 120 includes a non-self illuminating material such as a liquid crystal molecule, an electrophoretic display medium, or other applicable medium, but the disclosure is not limited thereto. In other embodiments, the display medium layer 120 may include a self-illuminating material such as inorganic material, an organic material, or other suitable material, or a combination thereof, or a combination of the above and the non-self illuminating material. When the display medium layer 120 is formed of a non-self illuminating material, the display panel 10 may include other backlight source (not shown).

To control the switch of the display medium layer 120, the element in the display region AR may, for example, selectively further include a display electrode 110, a plurality of signal lines (not shown), a light shielding pattern (not shown) and a switch element T, or other suitable element, or at least one of the above elements. The signal line (not shown) may be, for example, at least one of the at least one scan line (not shown), at least one data line (not shown), at least one common electrode line (not shown) and at least one power supply line (not shown).

When the element in the display region AR further selectively includes the display electrode 110, the display electrode 110 may be disposed between the first substrate 100 and the second substrate 200. The display electrode 110 may be, for example, a transmissive pixel electrode, a reflective pixel electrode, or a transflective pixel electrode. The transmissive pixel electrode may be a single-layer structure or a multi-layer structure, and the material thereof includes indium-tin-oxide, indium-zinc-oxide, aluminum-tin-oxide, aluminum-zinc-oxide, indium-germanium-zinc oxide, nano-carbon tube (rod), metal or alloy smaller than 60 Å or other suitable material. The reflective pixel electrode may be a single-layer structure or a multi-layer structure, and the material thereof includes metal, alloy or other suitable material.

When the element in the display region AR further selectively includes a switch element T, the switch element T may be disposed between the first substrate 100 and the second substrate 200. The switch element T may be, for example, electrically connected to the display electrode 110. The switch element T may be, for example, a thin film transistor element which includes a gate electrode, a gate insulating layer, a semiconductor channel layer, a source electrode and a drain electrode. For example, the switch element T may be a bottom gate thin film transistor element; for example, the gate electrode is located under the semiconductor channel layer, but the disclosure is not limited thereto. The switch element T may be a top gate thin film transistor element; for example, the gate electrode is located above the semiconductor channel layer, or other type of switch element. Specifically, the semiconductor channel layer may be a single-layer structure or a multi-layer structure, and the material thereof may be amorphous silicon, mono-crystalline, nano-crystalline silicon, microcrystalline silicon, polysilicon, organic semiconductor material, oxide semiconductor material, nano-carbon tube/rod, perovskite or other suitable material.

Further referring to FIG. 3 and FIG. 4, the display panel 10 may be, for example, selectively provided with a dielectric layer 130. The dielectric layer 130, for example, may be disposed between the first substrate 100 and the second substrate 200. From another perspective, the dielectric layer 130 is disposed on the first substrate 100. The dielectric layer 130 may cover a portion of the first substrate 100, a portion of the color conversion layer 300 and a portion of the image sensing layer 400. For example, the dielectric layer 130 is disposed on the first substrate 100, and the dielectric layer 130 may be disposed between the color conversion layer 300 and the switch element T as well as the first substrate 100 and the switch element T, but the disclosure is not limited thereto. In some embodiments, the dielectric layer 130 covers a portion of the first substrate 100, a portion of the color conversion layer 300, a portion of the image sensing layer 400, the reading element READ and the element connected thereto (e.g., reading line R and/or selecting line S). The material of the dielectric layer 130 may be, for example, an inorganic insulating material, an organic insulating material, or a stack of a combination thereof. The inorganic insulating material may be, for example, silicon oxide, silicon nitride, silicon oxynitride, other suitable material or a stack of the above materials. The organic insulating material may be acrylic, photoresist, epoxy resin, other suitable material, or a stack of the above materials.

Further referring to FIG. 3 and FIG. 4, the display panel 10 may be, for example, selectively provided with a protection layer 140. The protection layer 140 is, for example, disposed between the first substrate 100 and the second substrate 200. From another perspective, the protection layer 140 is disposed on the first substrate 100. The protection layer 140 may cover the switch element T, and the display electrode 110 is disposed on the protection layer 140, but the disclosure is not limited thereto. The material of the protection layer 140 may be, for example, an inorganic insulating material, an organic insulating material, or a stack of the combination thereof. The inorganic insulating material may be, for example, silicon oxide, silicon nitride, silicon oxynitride, other suitable material or a stack of the above materials. The organic insulating material may be acrylic, photoresist, epoxy resin, other suitable material or a stack of the above materials. The protection layer 140 may be, for example, selectively provided with a contact hole 142, and the display electrode 110 may be electrically connected to the switch element T through the contact hole 142, but the disclosure is not limited thereto. In other embodiments, the switch element T may be electrically connected to the display electrode 110 without the contact hole 142 of the protection layer 140.

In the embodiment, no matter whether the display panel 10 is a non-self illuminating display panel (e.g., the display panel 10 has display medium layer 120 formed of non-self illuminating material) or a self-illuminating display panel (e.g., the display medium layer 122 of the display panel 10 having self-illuminating material to be introduced below), the color conversion layer 300 not only can be disposed in the light shielding region NR of each of the sub-pixels PX, but also can be disposed in the display region AR of each of the sub-pixels PX. In the embodiment, the display panel 10 may further selectively include an additional color conversion layer (or referred to as additional wavelength conversion layer, not shown). In the embodiment, if the display panel 10 is the non-self illuminating display panel (e.g., the display panel 10 has the display medium layer 120 formed of non-self illuminating material), the additional color conversion layer (not shown) may be disposed on the second substrate 200, may serve as one of the dielectric layer 130 or the protection layer 140, may be disposed in the dielectric layer 130, or may be disposed in the protection layer 140, and the additional color conversion layer (not shown) may be further selectively disposed in the display region AR of each of the sub-pixels PX; other backlight source (not shown) mentioned above may be disposed on the outer side of the second substrate 200 instead of being located on the outer surface 100a of the first substrate 100 and between the first substrate 100 and the second substrate 200. In the embodiment, if the display panel 10 is a self-illuminating display panel (e.g., the display medium layer 122 of the display panel 10 having self-illuminating material to be introduced below), the additional color conversion layer (not shown) may be disposed on the second substrate 200, may serve as one of the dielectric layer 130 or the protection layer 140, may be disposed in the dielectric layer 130, or may be disposed in the protection layer 140, and the additional color conversion layer (not shown) may be further selectively disposed in the display region AR of each of the sub-pixels PX.

In the embodiment, the outer surface 100a of the first substrate 100 may serve as a viewing surface. From another perspective, the display surface of the display panel 10 may serve as the outer surface 100a of the first substrate 100, which may provide a display image for user to watch. Furthermore, the sub-pixels PX, the color conversion layer 300, the image sensing layer 400 and the dielectric layer 130 are disposed on the first substrate 100. In an embodiment, the electrode of the image sensing layer 400 closer to the first substrate 100 (e.g., one of the first electrode 410 or the second electrode 420) includes a transparent or a semi-transparent conductive material, e.g., the material described in the above-mentioned embodiment. Another electrode of the image sensing layer 400 farther from the first substrate 100 (e.g., the other one of the first electrode 410 or the second electrode 420) is preferably selected from a reflective conductive material (or referred to as non-transparent conductive material) or a stack layer of the reflective conductive material and the transparent conductive material, e.g., the material described in the above-mentioned embodiment. Based on the above, the light received by the image sensing element (e.g., one of image sensing elements 400r, 400g, 400b) of each of the sub-pixels PX may not be blocked by other shielding elements (e.g., reading element READ and element (e.g., reading line R and/or selecting line S) connected thereto, the switch element T and element (e.g., signal line, or other shielding element) connected thereto), thereby making it possible for the image sensing element (e.g., one of image sensing elements 400r, 400g, 400b) of each of the sub-pixels PX to receive more light and thus increasing the image sensing capability of the image sensing element (e.g., one of image sensing elements 400r, 400g and 400b) of each of the sub-pixels PX. In the embodiment, it is exemplified that the electrode (e.g., first electrode 410) of the image sensing layer 400 is closer to the first substrate 100 than another electrode (e.g., second electrode 420) is. Therefore, the transparency of the first electrode 410 including the transparent or semi-transparent conductive material is greater than the transparency of the second electrode 420 including non-transparent conductive material, and the second electrode 420 may serve as a light shielding element, but the disclosure is not limited thereto. From another perspective, the image sensing layer 400 may also be referred to as a light shielding element layer. When another electrode (e.g., second electrode 420) serves as the light shielding element, one of the following effects may be achieved, e.g.: blocking the ambient light from passing through the color conversion element (e.g., one of color conversion elements 300r, 300g and 300b) of each of the sub-pixels PX and the image sensing element (e.g., one of image sensing elements 400r, 400g and 400b), thereby reducing light mixture possibly generated between different sub-pixels PX, blocking the ambient light from passing through the color conversion element (e.g., one of color conversion elements 300r, 300g and 300b) of each of the sub-pixels PX and the image sensing element (e.g., one of image sensing elements 400r, 400g and 400b), thereby reducing photo-leakage current caused by converted color light which might enter the switch element T, or providing other suitable shielding effect.

Based on the above-mentioned embodiment, since each of the sub-pixels PX of the display panel 10 has the light shielding region NR and the display region AR, and at least a portion of the light shielding region NR of each of the sub-pixels PX may serve as the image sensing region NR-1 (including related element such as one of color conversion elements 300r, 300g, 300b, one of image sensing elements 400r, 400g, 400b, or other suitable elements) for sensing image, the usable area of the display region AR of each of the sub-pixels PX of the display panel 10 may be significantly increased, such that there is no need to adapt to other electronic elements (not shown) and sacrifice the usable area of the display region AR of each of the sub-pixels PX. Furthermore, based on the descriptions of the drawings in the embodiments (e.g., cross-sectional views in FIG. 3 and FIG. 4), since the image sensing element (e.g., image sensing elements 400r, 400g and 400b) disposed in the image sensing region NR-1 of the display panel 10 may serve as a camera with function (e.g., for the function of video, selfie, picture and/or text scanning, 3D recognition unlocking, or other functions applicable for the camera), the usable area (e.g., usable area of first substrate 100) of the display panel 10 may be significantly increased, such that there is no need to adapt to other electronic elements (not shown) and sacrifice the usable area (e.g., usable area of first substrate 100) and/or the image sensing resolution of the display panel 10 may be enhanced. Additionally, the display panel 10 is embedded with the image sensing element (e.g., image sensing elements 400r, 400g, 400b), such that the display panel 10 has lighter weight and/or thinner thickness.

Figure 5:
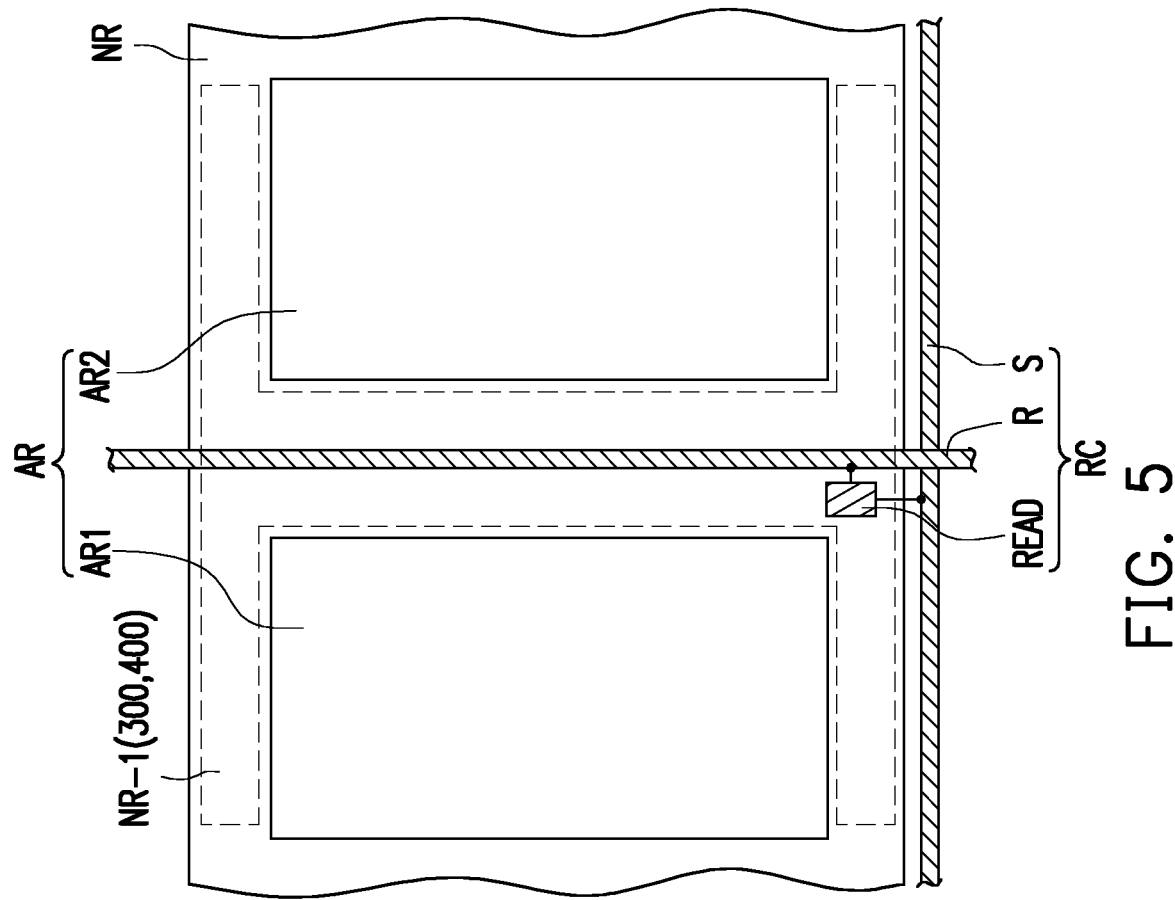
FIG. 5 is a top view of a sub-pixel of a display panel according to another embodiment of the disclosure.

FIG. 5 is a top view of a sub-pixel of a display panel according to another embodiment of the disclosure. It should be indicated that, the embodiment of FIG. 5 adopts the reference numeral and partial content of the embodiment of FIG. 2, wherein the same or similar reference numerals represent the same or similar elements, and the same technical content is omitted. The omitted descriptions can be derived from the embodiments and effects described above and thus no repetition is incorporated hereinafter.

Referring to FIG. 5, the single sub-pixel PX may have at least two display regions AR. In the embodiment shown in FIG. 5, the single sub-pixel PX has two display regions AR1, AR2, and the light shielding region NR is, for example, disposed in the periphery of the display regions AR1 and AR2 in the shape of letter "H", for example, but the disclosure is not limited thereto. Preferably, the two display regions AR1, AR2 may display colors that are substantially the same, but the disclosure is not limited thereto. Specifically, at least a portion of the light shielding region NR may serve as the image sensing region NR-1 in the presence of the color conversion element (e.g., one of color conversion elements 300r, 300g, 300b) and the image sensing element (e.g., one of image sensing elements 400r, 400g, 400b). For example, the projection shape of the image sensing region NR-1 is substantially the same as the projection shape of the light shielding region NR, or the projection shape of the image sensing region NR-1 is not equal to the projection shape of the light shielding region NR. As shown in the embodiment, the usable area of the display region AR of each of the sub-pixels PX may be significantly increased, and there is no need to adapt to other electronic elements (not shown) to sacrifice the usable area of the display region AR of each of the sub-pixels PX. Furthermore, the image sensing element (e.g., one of image sensing elements 400r, 400g, 400b) in the image sensing region NR-1 shown in the embodiment may serve as a camera having function (e.g., for the function of video, selfie, picture and/or text scanning, 3D recognition unlocking, or other functions applicable for the camera), and thus the usable area (e.g., usable area of first substrate 100) of the display panel 10 may be significantly increased, such that there is no need to adapt to other electronic elements (not shown) and sacrifice the usable area (e.g., usable area of first substrate 100) and/or the image sensing resolution of the display panel 10 may be enhanced. Additionally, the display panel 10 is embedded with the image sensing element (e.g., image sensing elements 400r, 400g, 400b), such that the display panel 10 has lighter weight and/or thinner thickness.

Figure 6:
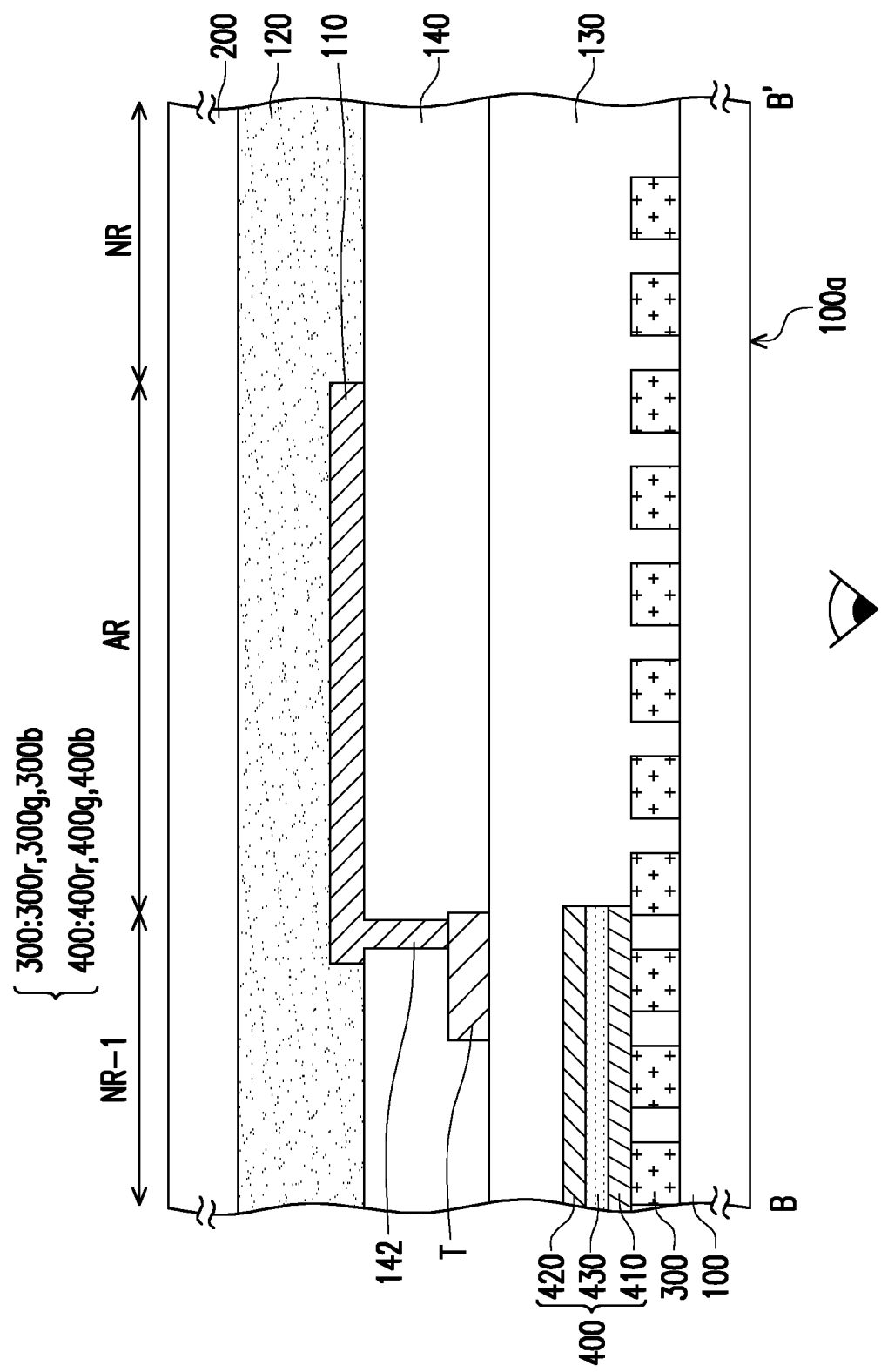
FIG. 6 is a schematic cross-sectional view of a sub-pixel in another embodiment of the display panel in the first embodiment of FIG. 2 taken along line B-B'.

FIG. 6 is a schematic cross-sectional view of a sub-pixel in another embodiment of the display panel in the first embodiment of FIG. 2 taken along line B-B'. It should be indicated that the embodiment of FIG. 6 adopts the reference numeral and partial content of the embodiment of FIG. 4, wherein the same or similar reference numeral represents the same or similar element, and the same technical content is omitted. The omitted descriptions can be derived from the embodiments and effects described above and thus no repetition is incorporated hereinafter.

Referring to FIG. 6, in the embodiment shown in FIG. 6, the color conversion element 300r, 300g and 300b may be a plurality of wire grids substantially parallel with each other and may be a single-layer structure or a multi-layer structure, and the material thereof may be metal, alloy, the inorganic material described above, the original material described above, or other suitable material. When the color conversion elements 300r, 300g and 300b are a plurality of wire grids substantially parallel with each other, a portion of the color conversion elements 300r, 300g, 300g corresponding to each of the sub-pixels PX may convert the light into different light colors such as red color, blue color or green color, such that the image sensing elements 400r, 400g and 400b corresponding to the color conversion elements 300r, 300g and 300b in at least a portion of the non-display region NR can respectively sense the corresponding color. The descriptions regarding the corresponding image sensing elements 400r, 400g and 400b can be derived from the above-mentioned embodiments. From another perspective, the color conversion elements 300r, 300g and 300b may be a plurality of wire grids substantially parallel with each other respectively, along with which the at least one portion of the non-display region NR in which the corresponding image sensing elements 400r, 400g and 400b are disposed may be referred to as image sensing region NR-1. Additionally, in some embodiments, a portion of the display region AR of each of the sub-pixels PX of the display panel 10 may be further selectively provided with color conversion elements 300r, 300g and 300b, and the plurality of wire grids that are substantially parallel with each other belonging to the color conversion elements 300r, 300g and 300b corresponding to a portion of the display region AR of each of the sub-pixels PX may also serve as a polarizer in the display region AR of each of the sub-pixels PX, thereby replacing typical polarizer (sheet) adhered to the outer surface 100a of the first substrate 100. With the design of the wire grid, the light may maintain to be collimated after passing through the wire grid. When the color conversion elements 300r, 300g and 300b are the wire grids respectively and correspond to the image sensing elements 400r, 400g and 400b respectively, the wire grids of the color conversion elements 300r, 300g and 300b may be referred to as a plurality of first wire grids. When the wire grids correspond to the display region AR of each of the sub-pixels PX, the wire grids may be referred to as a plurality of second wire grids. In an embodiment, the polarization cycle (or referred to as cycle or namely period) of the color conversion elements 300r, 300g and 300b corresponding to the image sensing region NR-1 may be larger than the polarization cycle of the color conversion elements 300r, 300g and 300b corresponding to the display region AR. The cycle of the color conversion elements 300r, 300g and 300b may be defined as that the width of one wire grid pluses the width of a gap between two adjacent wire grids in one of the color conversion elements 300r, 300g and 300b, or a sum of half width of each of the two adjacent wire grids pluses the width of gap between the two adjacent wire grids in one of the color conversion elements 300r, 300g and 300b. The width of the one wire grid in the at least one of the color conversion elements 300r, 300g and 300b corresponding to the image sensing region NR-1 is, for example, about 200 nm to about 700 nm, and the width of the gap between the two adjacent wire grids in the at least one of the color conversion elements 300r, 300g and 300b corresponding to the image sensing region NR-1 is, for example, about 122 nm to about 300 nm, but the disclosure is not limited thereto. The polarization cycle of at least one of the color conversion elements 300r, 300g and 300b corresponding to the display region AR is, for example, smaller than or substantially equal to 200 nm, and preferably smaller than or substantially equal to 120 nm, but the disclosure is not limited thereto. In an embodiment, the width of the one wire grid in the at least one of the color conversion elements 300r, 300g and 300b corresponding to the display region AR is, for example, about 10 nm to about 200 nm, and preferably about 30 nm to 100 nm, but the disclosure is not limited thereto. The cycles of the color conversion element 300r (e.g., red color conversion element), the color conversion element 300g (e.g., green color conversion element) and the color conversion element 300b (e.g., blue color conversion element) corresponding to different colors may be different. In other words, the first wire grids have various cycles. For example, the cycle of the color conversion element 300r (e.g. red color conversion element) corresponding to the image sensing region NR-1 of the first color (e.g., red image sensing region) is larger than the cycle of the color conversion element 300g (e.g., green color conversion element) corresponding to the image sensing region NR-1 of the second color (e.g., green image sensing region) and the cycle of the color conversion element 300b (e.g., blue color conversion element) corresponding to the image sensing region NR-1 of the third color (e.g., blue color image region), and the cycle of the color conversion element 300g (e.g., green color conversion element) corresponding to the image sensing region NR-1 of the second color (e.g., green image sensing region) is larger than the cycle of the color conversion element 300b (e.g., blue color conversion element) corresponding to the image sensing region NR-1 of the third color (e.g., blue image sensing region). In other words, the first wire grids of the first color conversion elements 300r (e.g., red color conversion element) may be referred to as a first set of wire grids, the first wire grids of the second color conversion element 300g (e.g., green color conversion element) may be referred to as a second set of wire grids, and the first wire grids of the third color conversion element 300b (e.g., blue color conversion element) may be referred to as a third set of wire grids. Likewise, if it is desired to equip the color conversion elements 300r, 300g and 300b corresponding to the display region AR of the sub-pixels PX of different colors with color conversion function other than the polarizing function, it may be designed as that the cycles of the color conversion element 300r (e.g., red color conversion element), the color conversion element 300g (e.g., green color conversion element) and the color conversion element 300b (e.g., blue color conversion element) corresponding to the display region AR of the sub-pixels PX of different colors are different. In other words, the second wire grids have various cycles. For example, the cycle of the color conversion element 300r (e.g. red color conversion element) corresponding to the display region AR of the first color sub-pixel PX (e.g., red color sub-pixel) is larger than the cycle of the color conversion element 300g (e.g., green color conversion element) corresponding to the display region AR of the second color sub-pixel PX (e.g., green color sub-pixel) and the cycle of the color conversion element 300b (e.g., blue color conversion element) corresponding to the display region AR of the third color sub-pixel PX (e.g., blue color sub-pixel), and the cycle of the color conversion element 300g (e.g., green color conversion element) corresponding to the display region AR of the second color sub-pixel PX (e.g., green color sub-pixel) is larger than the cycle of the color conversion element 300b (e.g., blue color conversion element) corresponding to display region AR of the third color sub-pixel PX (e.g., blue color sub-pixel). In other words, the second wire grids of the first color conversion element 300r (e.g., red color conversion element) corresponding to the first color sub-pixel PX may be referred to as the first set of wire grids, the second wire grids of the second color conversion element 300g (e.g., green color conversion element) corresponding to the second color sub-pixel PX may be referred to as the second set of wire grids, and the second wire grids of the third color conversion element 300b (e.g., blue color conversion element) corresponding to the third color sub-pixel PX may be referred to as the third set of wire grids. In some embodiments, it is optional to dispose additional color conversion layer (or referred to as additional wavelength conversion layer, not shown) on the image sensing layer 400 (e.g., image sensing elements 400r, 400g, 400b) in the image sensing region NR-1, thereby improving color purity of color.

In the embodiment, since the color conversion element (e.g., color conversion elements 300r, 300g, 300b) are a plurality of wire grids substantially parallel with each other, the color conversion elements (e.g., color conversion elements 300r, 300g, 300b) corresponding to the display region AR of different color sub-pixels PX may also serve as a polarizer. That is, the color conversion elements (e.g., color conversion elements 300r, 300g, 300b) may be used to allow only the light from a single direction, among the light that is vibrated toward every direction, to pass through, and the light that is vibrated toward other directions is blocked or absorbed. In this manner, the color conversion elements (e.g., color conversion elements 300r, 300g, 300b) in the embodiment keep the light to be emitted in a collimated manner, such that the visual quality for the user to watch the display panel 10 can be improved. Additionally, the embodiment may adopt the sub-pixels (e.g. sub-pixels shown in FIG. 5) described in the above-mentioned embodiment.

Figure 7:
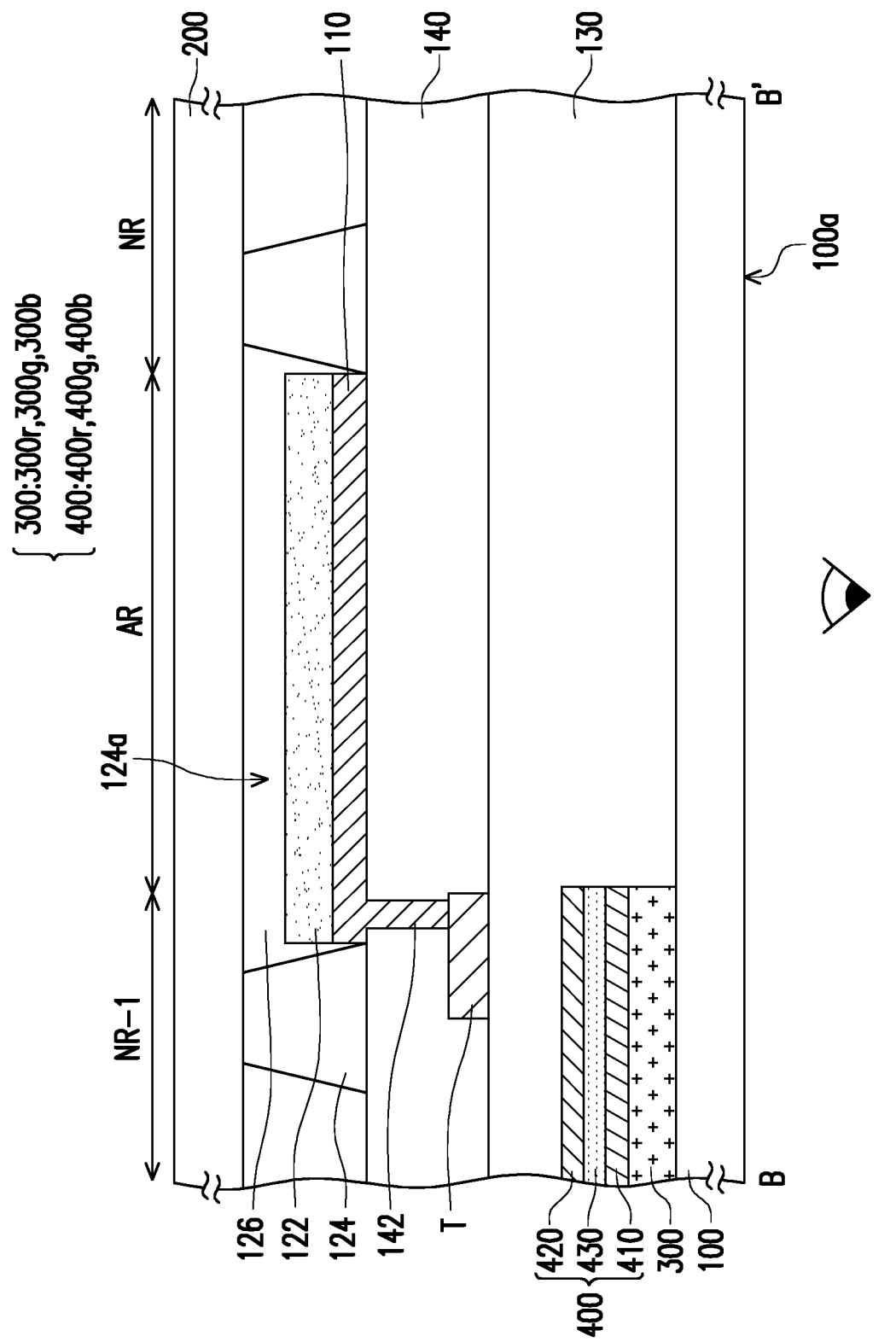
FIG. 7 is a schematic cross-sectional view of a sub-pixel in yet another embodiment of the display panel in the first embodiment of FIG. 2 taken along line B-B'.

FIG. 7 is a schematic cross-sectional view of a sub-pixel in yet another embodiment of the display panel in the first embodiment of FIG. 2 taken along line B-B'. It should be indicated that, the embodiment of FIG. 7 adopts the reference numeral and partial content of the embodiment of FIG. 4, wherein the same or similar reference numeral represents the same or similar element, and the same technical content is omitted. The omitted descriptions can be derived from the embodiments and effects described above and thus no repetition is incorporated hereinafter.

Referring to FIG. 7, FIG. 7 illustrates a schematic cross-sectional view of a sub-pixel according to another embodiment. In an embodiment, the display medium layer 122 provided in the display panel 10 is, for example, a micro light emitting element (or referred to as display element), and different sub-pixels PX disposed in the display region AR may respectively display different colors. In some embodiments, the micro light emitting element may be electrically connected to the above-mentioned signal line (e.g., at least one of the at least one scan line (not shown), at least one data line (not shown), at least one common electrode line (not shown), at least one power supply line (not shown), or other suitable line) through the corresponding switch element T. The size of the micro light emitting element is, for example, smaller than 100 μm, preferably smaller than 50 μm but larger than 0 μm. The micro light emitting element may be, for example, an organic light emitting element and/or an inorganic light emitting element, and preferably, may be an inorganic light emitting element, the disclosure is not limited thereto. The structure of the micro light emitting element may be a P-N diode, a P-I-N diode or other suitable structure. When the micro light emitting element is an organic light emitting element, the micro light emitting element may, for example, include an organic light emitting layer (not shown) and two electrodes, and the organic light emitting layer is disposed between the two electrodes. For example, one of the two electrodes may be a display electrode 110, or one of the two electrodes may be electrically connected to the display electrode 110. The material of the organic light emitting layer may be an organic polymer light emitting material, an organic small molecule light emitting material, an organic complex light emitting material or other suitable material. In some embodiments, the organic light emitting layer corresponding to different color sub-pixels PX may, for example, include an organic light emitting layer corresponding to the first color sub-pixel PX (e.g., red sub-pixel) may be, for example, a red organic light emitting layer, an organic light emitting layer corresponding to the second color sub-pixel PX (e.g. green sub-pixel) may be, for example, a green organic light emitting layer, an organic light emitting layer corresponding to the third color sub-pixel PX (e.g., blue sub-pixel) may be, for example, a blue organic light emitting layer, and an organic light emitting layer corresponding to other color sub-pixel PX (e.g., other color sub-pixel) may be, for example, an other colors light emitting layer, or an other suitable color organic light emitting layer, or a combination thereof. When the micro light emitting element is the inorganic light emitting element, the micro light emitting element may, for example, include an inorganic light emitting layer (not shown) and two electrodes, and the inorganic light emitting layer is disposed between the two electrodes, such that the micro light emitting element forms an electrode structure arranged vertically, that is, the two electrodes are respectively disposed on different sides of the inorganic light emitting layer. When the micro light emitting element is the electrode structure that is arranged vertically, one of the two electrodes of the micro light emitting element may be directly in contact with the display electrode 110 or electrically connected to the display electrode 110 through a conductive material (e.g., indium, tin, gold, or other suitable material or a combination thereof), and the micro light emitting element may be regarded as being disposed on the display electrode 110. In other embodiments, the two electrodes may also be disposed on the same side of the inorganic light emitting layer, such that the micro light emitting element forms an electrode structure arranged horizontally. When the micro light emitting element is the electrode structure arranged horizontally, the micro light emitting element may be adhered to the first substrate 100 through an adhesive layer (not shown), and the one of the two electrodes of the micro light emitting element is electrically connected to the display electrode 110, and the adhesive layer (not shown) may have insulation property (preferably, but not limited thereto), such that abnormal current direction can be avoided. The material of the inorganic light emitting layer may be, for example, perovskite material, rare earth ion light emitting material, rare earth phosphor material, semiconductor light emitting material or other suitable material.

Furthermore, the display panel 10 may further selectively include a display defining pattern 124, which may be disposed on the first substrate 100, but the disclosure is not limited thereto. In other embodiments, the display defining pattern 124 may be disposed on the second substrate 200 or divided into two parts respectively disposed on the first substrate 100 and the second substrate 200. The micro light emitting element may be disposed in at least one opening 124a included in the display defining pattern 124. When the micro light emitting element is the electrode structure arranged horizontally, the micro light emitting element may be adhered to the first substrate 100 through the adhesive layer (not shown) that is only disposed in the opening 124a, but the disclosure provides is not limited to the micro light emitting element which is the electrode structure arranged horizontally. In other embodiments, a filler layer 126 may be further selectively disposed between the second substrate 200 and the first substrate 100, and may be filled in the opening 124a and, for example, may surround and/or cover the micro light emitting element so as to better protect the micro light emitting element, but the disclosure is not limited thereto.

In the embodiment, the color conversion elements 300r, 300g, 300b of the display panel 10 may also use the plurality of wire grids substantially parallel with each other as described in the above-mentioned embodiment, and related descriptions may be derived from the above-mentioned embodiments; therefore, no repetition is incorporated hereinafter. Additionally, the embodiment may also adopt the sub-pixels described in the above-mentioned embodiment (e.g., sub-pixels shown in FIG. 5).

Figure 8:
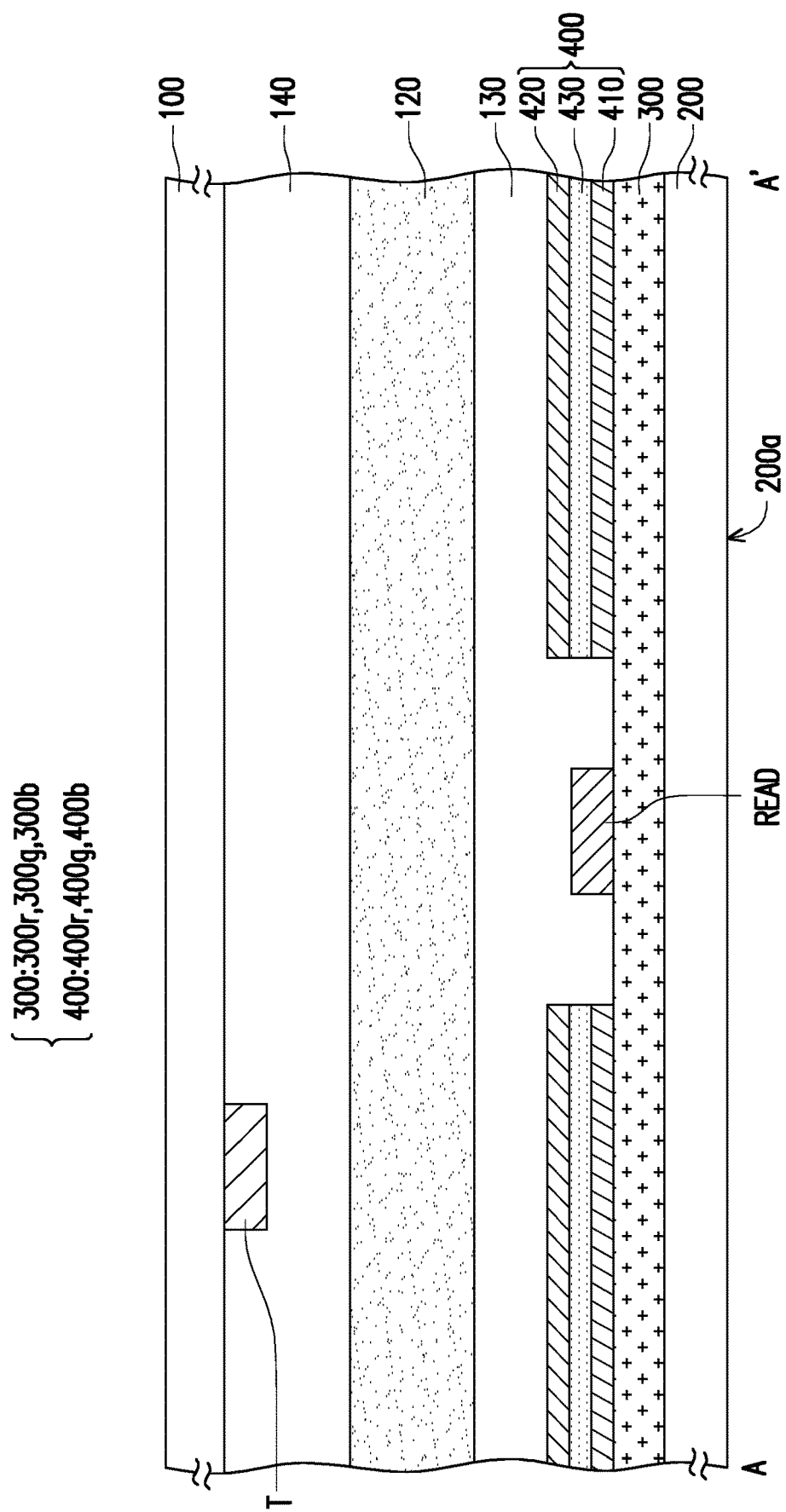
FIG. 8 is a schematic cross-sectional view of a sub-pixel in one embodiment of a display panel in a second embodiment of FIG. 2 taken along line A-A'.
Figure 9:
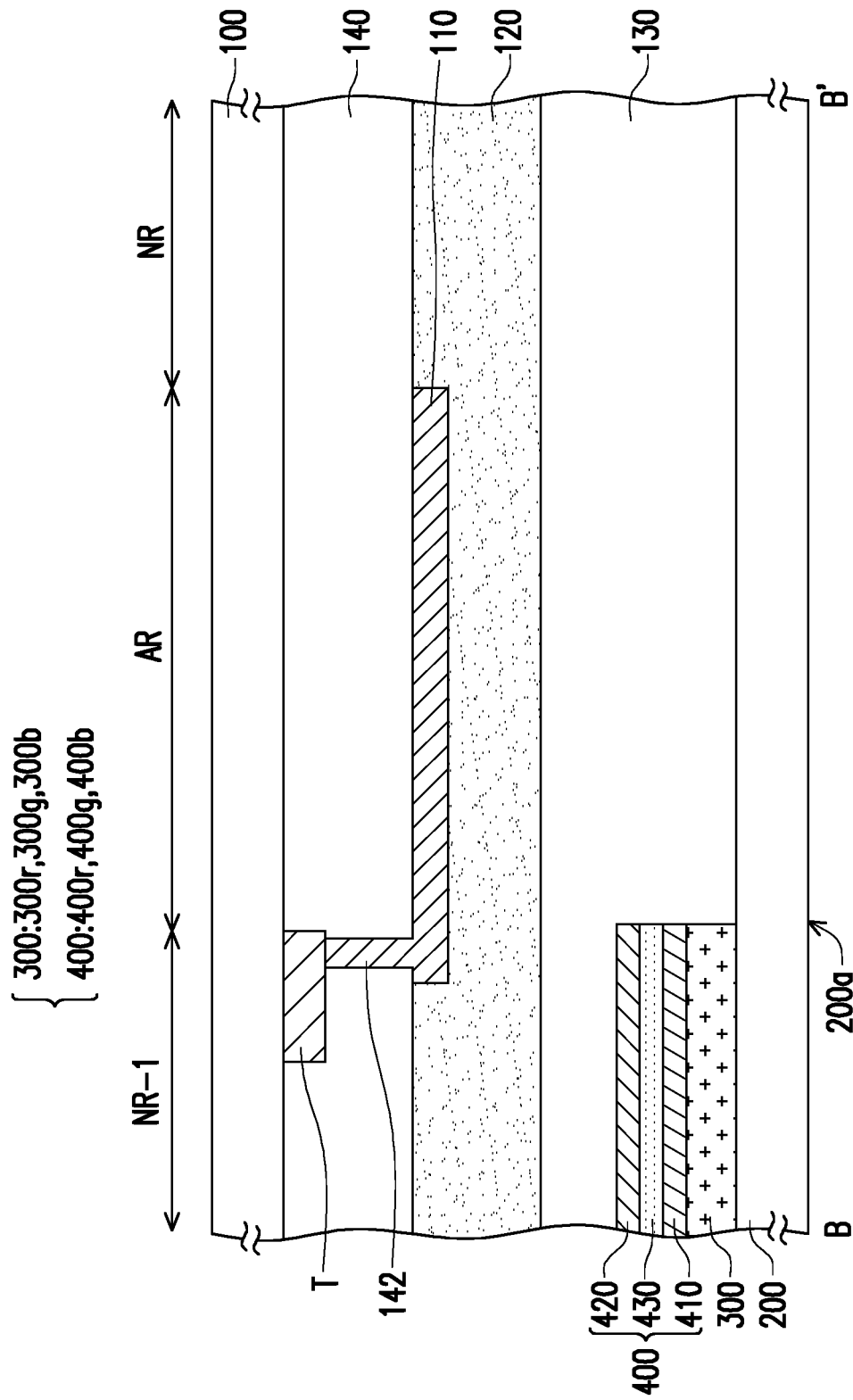
FIG. 9 is a schematic cross-sectional view of a sub-pixel in one embodiment of the display panel in the second embodiment of FIG. 2 taken along line B-B'.

FIG. 8 is a schematic cross-sectional view of a sub-pixel in one embodiment of a display panel in a second embodiment of FIG. 2 taken along line A-A'. FIG. 9 is a schematic cross-sectional view of a sub-pixel in one embodiment of the display panel in the second embodiment of FIG. 2 taken along line B-B'. Referring to FIG. 2, FIG. 8 and FIG. 9, a display panel 20 in the embodiment includes the first substrate 100, the second substrate 200, the color conversion layer 300 and the image sensing layer 400. It should be indicated that the embodiments of FIG. 8 and FIG. 9 respectively adopt the element numeral and partial content of the embodiments of FIG. 3 and FIG. 4, wherein the same or similar numerals represent the same or similar elements, and the same technical content is omitted. The omitted partial descriptions may be derived from the above-mentioned embodiments and effects and correspondingly modified; therefore, no repetition is incorporated in the following embodiment.

Referring to FIG. 8 and FIG. 9, in the embodiment, an outer surface 200a of the second substrate 200 serves as a viewing surface. From another perspective, the display surface of the display panel 20 may be the outer surface 200a of the second substrate 200, which may provide a display image for user to watch. Therefore, comparing the configuration relationship between the sub-pixels PX, the dielectric layer 130, the protection layer 140, the color conversion layer 300 and the image sensing layer 400 located between the first substrate 100 and the second substrate 200 with the embodiments in FIG. 3 and FIG. 4, the difference between the two is described as follows. The sub-pixel PX is disposed on the first substrate 100, and the color conversion layer 300, the image sensing layer 400 as well as the dielectric layer 130 are disposed on the second substrate 200. The switch element T may be disposed on the first substrate 100, the protection layer 140 may also be disposed on the first substrate 100 and located between the first substrate 100 and the second substrate 200 while covering the switch element T. In some embodiments, the display panel 20 may not be provided with the protection layer 140. The dielectric layer 130 covers the image sensing layer 400 and a portion of the second substrate 200. Furthermore, the dielectric layer 130 may further cover a portion of the color conversion layer 300. When the display medium layer 120 is the non-self illuminating material, other backlight source (not shown) in the above-mentioned embodiment may be disposed on the outer side of the first substrate 100 instead being located on the outer surface 200a of the second substrate 200 and between the second substrate 200 and the first substrate 100.

In an embodiment, the electrode (e.g., first electrode 410) of the image sensing layer 400 closer to the second substrate 200 may include a transparent or semi-transparent conductive material (descriptions related to the material may be derived from the above-mentioned embodiment). Another electrode (e.g., second electrode 420) of the image sensing layer 400 farther from the second substrate 200 is preferably selected from a reflective conductive material (or referred to as non-transparent conductive material), or a stack layer of the reflective conductive material and the transparent conductive material (descriptions related to the material may be derived from the above-mentioned embodiment), and another electrode (e.g., second electrode 420) of the image sensing layer 400 farther from the second substrate 200 may serve as, for example, the light shielding element described in the above-mentioned embodiment (as described in FIG. 3 and FIG. 4), and related descriptions can be derived from the above-mentioned embodiment; therefore, no repetition is incorporated hereinafter. Also, the embodiment may adopt the sub-pixel (e.g., sub-pixel shown in FIG. 5) described in the above-mentioned embodiment.

Based on the descriptions regarding the illustration (e.g., cross-sectional views in FIG. 8 and FIG. 9) of the embodiment, since the image sensing element (e.g., image sensing elements 400r, 400g, 400b) disposed in the image sensing region NR-1 of the display panel 20 may serve as a camera having function (e.g., for the function of video, selfie, picture and/or text scanning, 3D recognition unlocking, or other functions applicable for the camera), the usable area of the display panel 20 (e.g., usable area of second substrate 200) may be significantly increased, such that there is no need to adapt to other electronic elements (not shown) and sacrifice the usable area (e.g., usable area of second substrate 200) and/or the image sensing resolution of the display panel 20 may be enhanced. Furthermore, the sub-pixel PX in the embodiment is disposed on the first substrate 100, and the color conversion layer 300, the image sensing layer 400 as well as the dielectric layer 130 are disposed on the second substrate 200, as compared with the above-mentioned embodiment (e.g., the color conversion layer 300, sub-pixel PX, image sensing layer 400 and dielectric layer 130 are all disposed on the first substrate 100), the embodiment may further improve the flexibility of manufacturing process, and the margin of circuit design may be increased.

Figure 10:
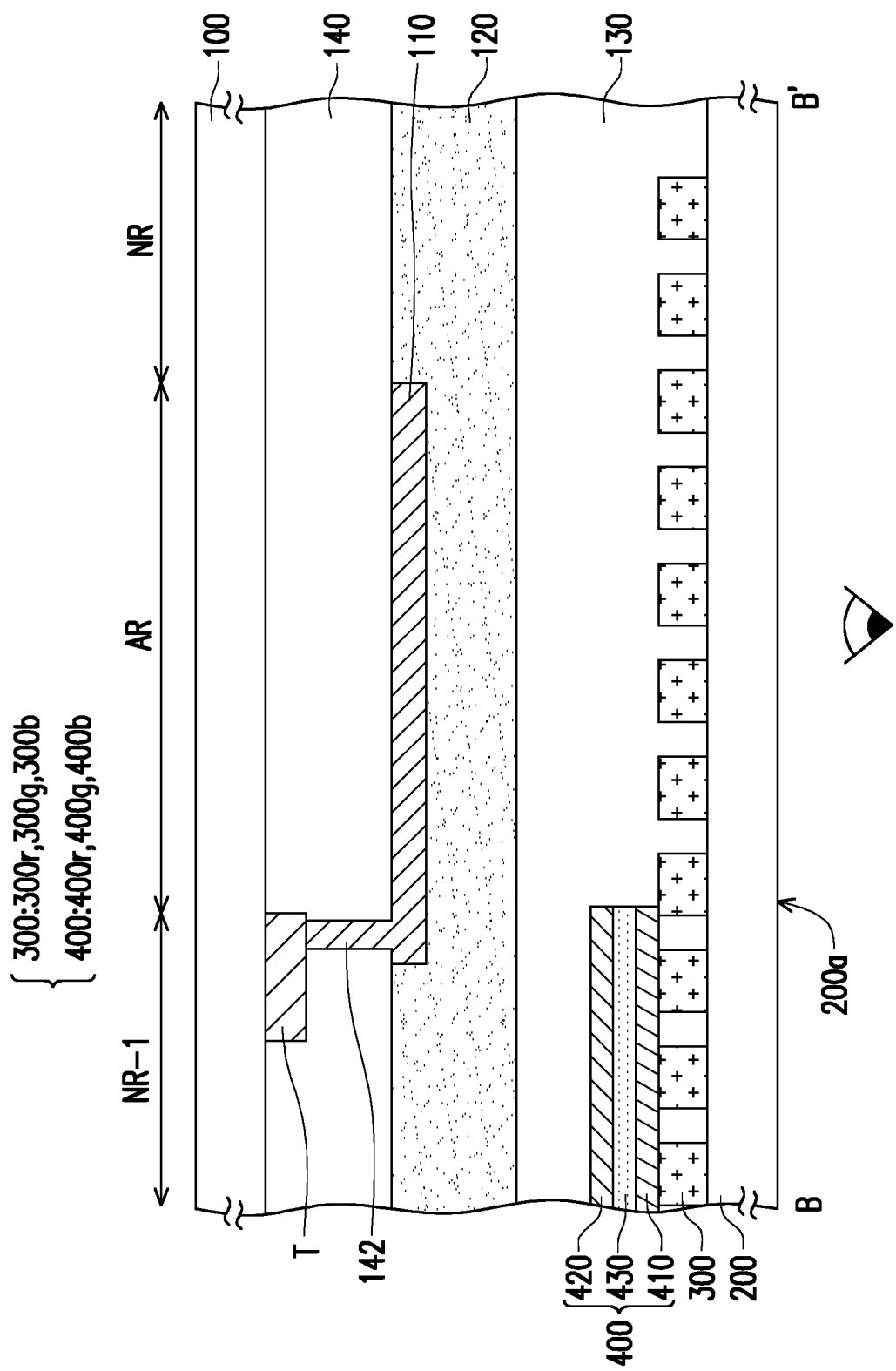
FIG. 10 is a schematic cross-sectional view of a sub-pixel in another embodiment of the display panel in the second embodiment of FIG. 2 taken along line B-B'.

FIG. 10 is a schematic cross-sectional view of a sub-pixel in another embodiment of the display panel in the second embodiment of FIG. 2 taken along line B-B'. It should be indicated that, the embodiment of FIG. 10 adopts the reference numeral and partial content of the embodiment of FIG. 9, wherein the same or similar reference numerals represent the same or similar elements, and the same technical content is omitted. The omitted descriptions can be derived from the embodiments and effects described above and thus no repetition is incorporated hereinafter.

Referring to FIG. 10, the main difference between the embodiment of FIG. 10 and the embodiment of FIG. 9 is that the color conversion elements 300r, 300g and 300b may be a plurality of wire grids substantially parallel with each other, and the property and effect of the wire grids can be derived from the above-mentioned embodiments (e.g., embodiment of FIG. 6); therefore, no repetition is incorporated hereinafter. In the embodiment, the outer surface 200a of the second substrate 200 may serve as a viewing surface. From another perspective, the display surface of the display panel 20 may be the outer surface 200a of the second substrate 200, which may provide a display image for the user to watch. Furthermore, the descriptions and mutual relationship between the sub-pixel PX, the dielectric layer 130, the protection layer 140, the color conversion layer 300, the image sensing layer 400 or other elements of the display panel 20 can be derived from the descriptions of the above-mentioned embodiments (e.g., FIG. 8 and FIG. 9); therefore, no repetition is incorporated hereinafter. The embodiment may also adopt the sub-pixel (e.g., sub-pixel shown in FIG. 5) described in the above-mentioned embodiment.

Figure 11:
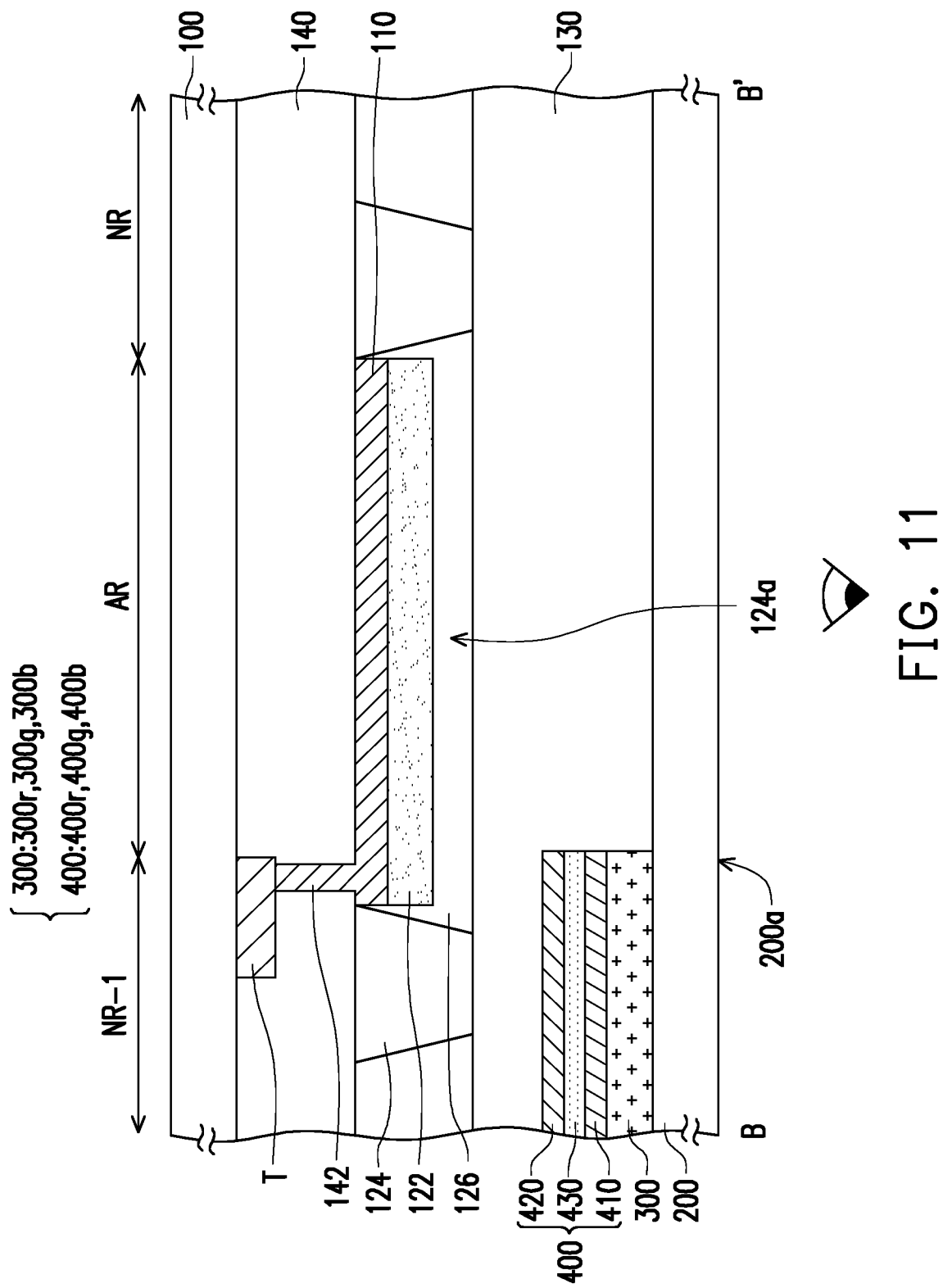
FIG. 11 is a schematic cross-sectional view of a sub-pixel in yet another embodiment of the display panel in the second embodiment of FIG. 2 taken along line B-B'.

FIG. 11 is a schematic cross-sectional view of a sub-pixel in yet another embodiment of the display panel in the second embodiment of FIG. 2 taken along line B-B'. It should be indicated that, the embodiment of FIG. 11 adopts the reference numeral and partial content of the embodiment of FIG. 9, wherein the same or similar reference numerals represent the same or similar elements, and the same technical content is omitted. The omitted descriptions can be derived from the embodiments and effects described above and correspondingly modified and thus no repetition is incorporated hereinafter.

Referring to FIG. 11, the main difference between another embodiment shown in FIG. 11 and the embodiment of FIG. 10 is that the display medium layer 122 of the display panel 20 is, for example, a micro light emitting element (or referred to as display element), which is disposed on the first substrate 100. In some embodiments, the display panel 20 may further selectively include the display defining pattern 124, which may be disposed on the first substrate 100, but the disclosure is not limited thereto. In other embodiments, the display defining pattern 124 may be disposed on the second substrate 200 or divided into two portions respectively disposed on the first substrate 100 and the second substrate 200. The micro light emitting element may be disposed in at least one opening 124a included in the display defining pattern 124. In the embodiment shown in FIG. 11, the property and related descriptions of the micro light emitting element and the display defining pattern 124 can be derived from the above-mentioned embodiment (e.g., embodiment of FIG. 7) and correspondingly modified, and thus no repetition is incorporated hereinafter. Also, the embodiment may adopt the sub-pixel (e.g., sub-pixel shown in FIG. 5) described in the above-mentioned embodiment and/or the color conversion elements 300r, 300g and 300b may be a plurality of wire grids substantially parallel with each other, and the property and effect thereof can be derived from the descriptions of the above-mentioned embodiments (e.g., embodiment of FIG. 6).

Figure 12:
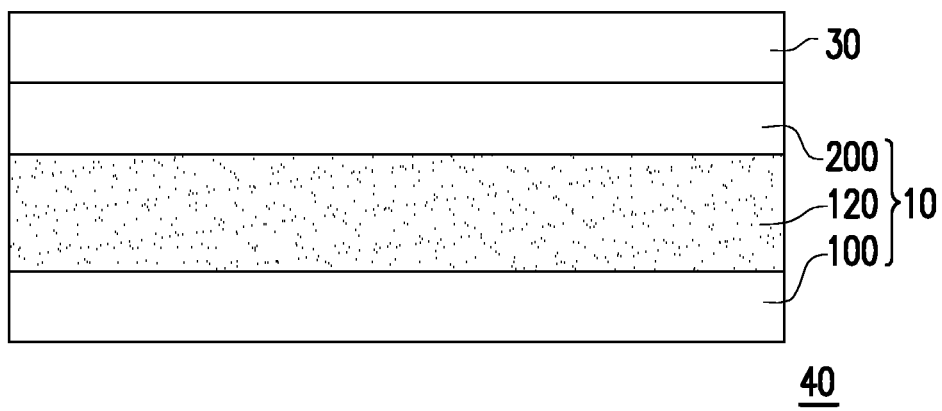
FIG. 12 is a schematic cross-sectional view of a display panel integrated with a touch element according to an embodiment of the disclosure.
Figure 13:
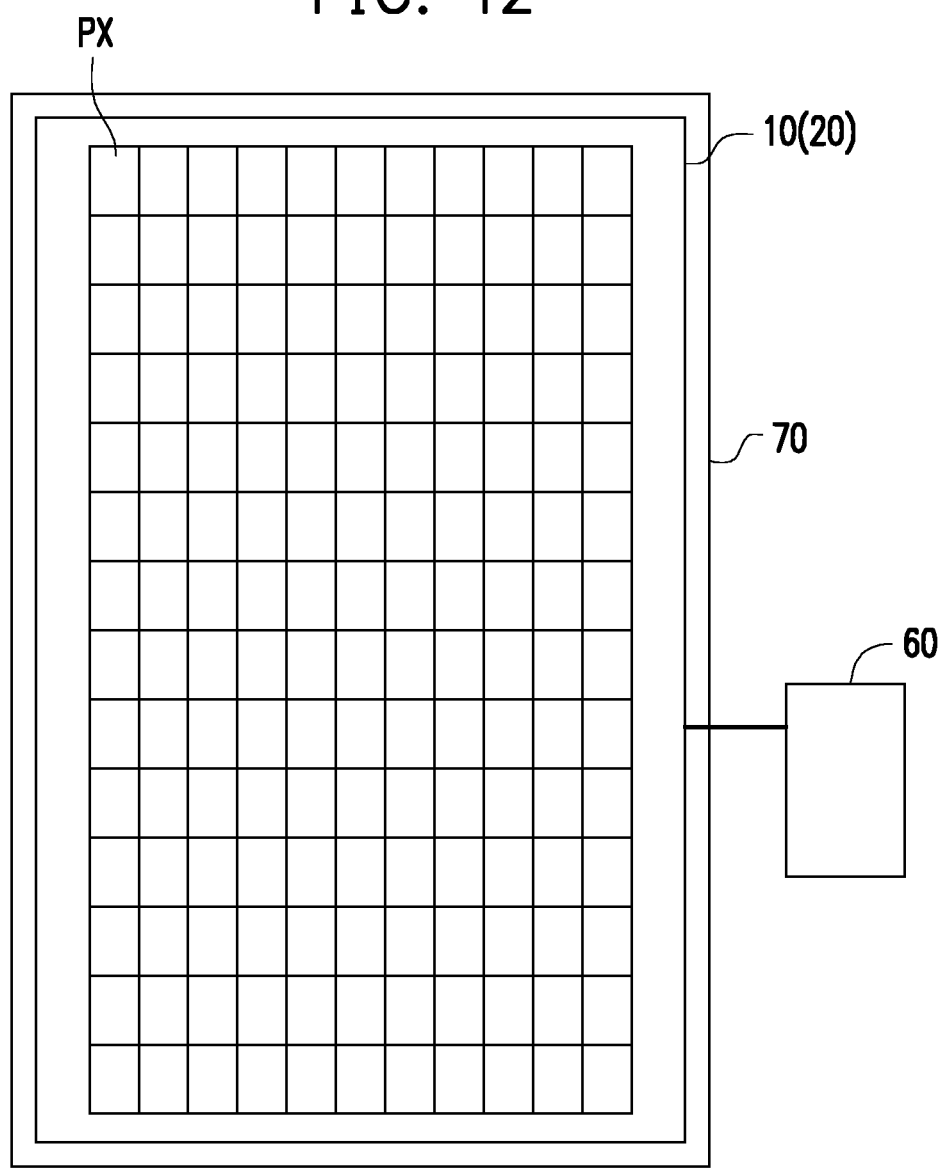
FIG. 13 is a schematic top view of an electronic device including a display panel according to an embodiment of the disclosure.

FIG. 12 is a schematic cross-sectional view of a display panel integrated with a touch element according to an embodiment of the disclosure. FIG. 13 is a schematic top view of an electronic device including a display panel according to an embodiment of the disclosure. Referring to FIG. 12, the display panel 10 or the display panel 20 may further include a touch element 30. That is, the touch element 30 and the display panel 10 or display panel 20 described in one of the above-mentioned embodiments may be integrated to form a touch display panel 40. The touch element 30 overlaps at least a portion of the display unit AU. FIG. 12 illustrates a touch display panel accorded to an embodiment of the disclosure. Hereinafter, it is exemplified that the touch element 30 and the display panel 10 includes the display medium layer 120 are integrated to form the touch display panel 40. The touch display panel 40, for example, includes the first substrate 100, the display medium layer 120, the second substrate 200 and the touch element 30. In the example where the touch element 30 and the display panel 20 includes the display medium layer 122 are integrated to form the touch display panel 40, the touch display panel 40 may, for example, include the first substrate 100, the display medium layer 122, the second substrate 200 and the touch element 30. The first substrate 100 and the second substrate 200 are disposed opposite to each other, and the display medium layer 120 or 122 is disposed between the first substrate 100 and the second substrate 200. In the embodiment, the touch element 30 is, for example, formed on the outer side of the second substrate 200 or formed on the outer side of the first substrate 100 to form an on-cell touch display panel, but the disclosure is not limited thereto. The touch element 30 may be, for example, detachably disposed on the display panel 10 or the display panel 20 to form an out-cell touch display panel. Additionally, the touch element may be disposed within the display panel 10 or the display panel 20, for example, on the inner surface of at least one of the first substrate 100 and the second substrate 200 to form an in-cell touch display panel. In other embodiments, the touch element 30 may be used along with related electrode of the micro light emitting element (display medium layer 122), e.g., one of the two electrodes of the micro light emitting element, at least one electrode of storage capacitance, other suitable electrode or a combination of at least one thereof.

Referring to FIG. 13, the display panel 10 or the display panel 20 described in the above-mentioned embodiment of the disclosure may be applied to an electronic device 50. FIG. 13 illustrates a schematic top view of the electronic device 50 including the display panel 10 or the display panel 20. Preferably, when the electronic device 50 including the display panel 10 or the display panel 20 of the above-mentioned embodiment of the disclosure is viewed from the front side, a housing 70 is less visible, and shown with an extremely narrow frame, or even frameless. Furthermore, when facing the electronic device 50, preferably, the outer surface of the display panel 10 or the display panel 20 is visible, and it is less likely to see a hole which is configured for accommodating an electronic element module having other function (for example, a hole that accommodating speaker, a hole that accommodating shooter, or a hole accommodating other element) and/or a mechanical element (e.g., press-type mechanical piece or other mechanical piece), such that the display panel 10 or the display panel 20 of the electronic device 50 exhibits a full screen display image. In an embodiment, the display panel 10 or the display panel 20 may be, for example, electrically connected to an electronic element 60 to be assembled as the electronic device 50. In other embodiments, the housing 70 may accommodate the display panel 10 or the display panel 20 and the electronic element 60, but the disclosure is not limited thereto. The electronic element 60 may be, for example, a control element, an operating element, a processing elements, an input elements, a memory element, a driving element, a light emitting element, a protection element, a sensing element, a detecting element, an element with other function, or a combination of the above elements. Moreover, the type of the electronic device 50 may be, for example, a portable product (e.g., smart phone, video camera, photo-camera, notebook computer, game player, music player, e-mail transceiver, map navigator, digital frame or the like), a video product (e.g., video player or the like), a screen, a TV, an outdoor/indoor signage or a panel of projector and so on.

Based on the above, the electronic device 50 including the display panel 10 or the display panel 20 described in the above-mentioned embodiment may have higher screen-to-body ratio. Meanwhile, since the image sensing element (e.g., image sensing element 400r, 400g, 400b) is disposed on the first substrate 100 or the second substrate 200 of the display panel 10 or the display panel 20, the electronic device 50 including the display panel 10 or the display panel 20 is more compact, thereby reducing user's burden when carrying the electronic device 50.

Furthermore, the display panel 10 or 20 described in one of the above-mentioned embodiments may further selectively include a plurality of transparent regions (not shown) and is associated with the sub-pixels PX of at least one of the display units AU, such that the display panel 10 or 20 may serve as the transparent display panel, and the electronic device 50 including the transparent display panel may be referred to as transparent electronic device. For example, at least one transparent region may serve as a transparent unit which may correspond to at least one display unit AU, at least one transparent region may serve as a transparent sub-pixel which may correspond to at least one sub-pixel PX, at least one transparent region may be a portion of at least one display unit AU, or the at least one transparent region may be a portion of at least one sub-pixel PX (e.g., a portion of the display region AR of at least one sub-pixel PX). The transparent region (not shown), preferably, may be selectively provided without the display medium layer 120 or 122, but the disclosure is not limited thereto.

In summary, the disclosure is configured in the manner that the image sensing element is disposed within the display panel, such that all of the regions in the display region of the display panel of the disclosure may serve the display function, and thus the valid display region of the display panel may be less affected and even enhanced. Besides, the image sensing capability of the display panel embedded with image sensing element of the disclosure may be less affected and even improved while serve as camera. The display panel embedded with the image sensing element allows the display panel to have lighter weight and/or thinner thickness. Moreover, the design of the display panel of the disclosure allows the image sensing element to be close to the first substrate or the second substrate, which increases flexibility of manufacturing process and/or increases margin of circuit. Additionally, the electronic device including the display panel of the disclosure has high screen-to-body ratio accordingly. Furthermore, since the image sensing element of the disclosure is disposed within the display device, the electronic device including the display panel may have lighter weight and/or thinner thickness, thereby reducing user's burden when carrying the electronic device.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A display panel, comprising:
a first substrate; and
a second substrate, corresponding to the first substrate, wherein a plurality of display units are provided between the first substrate and the second substrate, at least one of the display units respectively comprises three sub-pixels configured to display different colors respectively, the sub-pixels respectively have at least one switch element electrically connected to a signal line, wherein the sub-pixels respectively at least have a display region and a light shielding region disposed on at least one side of the display region, and at least one display element is disposed in the display region;
a color conversion layer, disposed on the display units, wherein the color conversion layer comprises three color conversion elements respectively corresponding to the sub-pixels, and the color conversion elements respectively convert a light into different colors, wherein each of the color conversion elements is disposed in at least one portion of the light shielding region of each of the sub-pixels; and
an image sensing layer, disposed on the display units and at least partially overlapping the color conversion layer, wherein the image sensing layer comprises three image sensing elements respectively corresponding to the sub-pixels, and each of the image sensing elements is electrically connected to a reading line through at least one reading element, wherein each of the image sensing elements is disposed in at least one portion of the light shielding region of each of the sub-pixels to serve as an image sensing region.

2. The display panel according to claim 1, further comprising a dielectric layer, wherein an outer surface of the first substrate serves as a viewing surface, the sub-pixels, the color conversion layer, the image sensing layer and the dielectric layer are disposed on an inner surface of the first substrate, wherein the dielectric layer covers the image sensing element, a portion of the first substrate and a portion of the color conversion layer, the dielectric layer is disposed between the color conversion layer and the switch elements and between the first substrate and the switch elements.

3. The display panel according to claim 2, wherein each of the image sensing elements comprises a first electrode, a second electrode corresponding to the first electrode and a photoelectric conversion layer disposed between the first electrode and the second electrode, wherein the first electrode is closer to the first substrate than the second electrode is.

4. The display panel according to claim 3, wherein the first electrode of each of the image sensing elements has a transparency greater than the second electrode, and the second electrode serves as a light shielding element.

5. The display panel according to claim 1, further comprising a dielectric layer, wherein an outer surface of the second substrate serves as a viewing surface, the sub-pixels are disposed on an inner surface of the first substrate, and the color conversion layer, the image sensing layer and the dielectric layer are disposed on an inner surface of the second substrate, wherein the dielectric layer covers the image sensing elements and a portion of the second substrate.

6. The display panel according to claim 5, wherein each of the image sensing elements comprises a first electrode, a second electrode corresponding to the first electrode and a photoelectric conversion layer disposed between the first electrode and the second electrode, wherein the first electrode is closer to the second substrate than the second electrode is.

7. The display panel according to claim 6, wherein the first electrode of each of the image sensing elements has a transparency greater than the second electrode, and the second electrode serves as a light shielding element.

8. The display panel according to claim 1, wherein each of the color conversion elements comprises at least two layers, and refractive indexes of the layers are different.

9. The display panel according to claim 1, wherein each of the color conversion elements comprises a plurality of first wire grids substantially parallel with each other, and any two adjacent first wire grids has a gap therebetween.

10. The display panel according to claim 9, wherein the first wire grids of the color conversion elements have various cycles.

11. The display panel according to claim 9, wherein the color conversion elements have three sets of the first wire grids respectively corresponding to the image sensing elements of the sub-pixels, the three sets of wire grids respectively have a cycle, and the cycles are different from each other.

12. The display panel according to claim 9, further comprising a plurality of second wire grids respectively corresponding to the display region of each of the sub-pixels, a cycle of the first wire grids corresponding to each of the sub-pixels is larger than a cycle of the second wire grids, and the second wire grids serve as a polarizer.

13. The display panel according to claim 1, wherein each of the sub-pixels further has a display electrode disposed in the display region, and the display element is disposed on the display electrode.

14. The display panel according to claim 1, wherein each of the sub-pixels further has a display defining pattern, the display defining pattern has at least one opening, and the display element is disposed in the opening.

15. The display panel according to claim 1, further comprising a touch element, the touch element overlapping at least a portion of the display units.

16. An electronic device, comprising the display panel according to claim 1.

* * * * *